United States Patent

Hiroki

[11] Patent Number: 5,989,346
[45] Date of Patent: Nov. 23, 1999

[54] SEMICONDUCTOR PROCESSING APPARATUS

[75] Inventor: Tsutomu Hiroki, Yamanashi-ken, Japan

[73] Assignee: Tokyo Electron Limited, Tokyo, Japan

[21] Appl. No.: 08/762,951

[22] Filed: Dec. 10, 1996

[30] Foreign Application Priority Data

| Dec. 12, 1995 | [JP] | Japan | 7-323094 |
| Nov. 25, 1996 | [JP] | Japan | 8-313420 |
| Jan. 26, 1999 | [JP] | Japan | 8-032927 |

[51] Int. Cl.$^6$ ................................................ C23C 16/00
[52] U.S. Cl. .................... 118/719; 414/935; 414/938; 414/939
[58] Field of Search ..................... 118/719; 156/345; 414/935, 938, 939

[56] References Cited

U.S. PATENT DOCUMENTS

| 5,746,565 | 5/1998 | Tepolt | 414/744.5 |
| 5,823,736 | 10/1998 | Matsumura | 414/609 |
| 5,851,296 | 12/1998 | Haraguchi et al. | 118/719 |

*Primary Examiner*—Bruce Breneman
*Assistant Examiner*—Enn Fieler
*Attorney, Agent, or Firm*—Oblon, Spivak, McClelland, Maier & Neustadt, P.C.

[57] ABSTRACT

In a semiconductor processing apparatus, an external transfer mechanism transfers substrates between a cassette for storing a plurality of target substrates by vertically arranging the substrates at first intervals, and a processing section for performing semiconductor processing for the substrates. The external transfer mechanism has first and second arms defining first and second support surfaces each of which can support one of the substrates and capable of vertically moving relative to each other. An interval adjuster is disposed to adjust an interval in a vertical direction between the first and second support surfaces by moving the first and second arms relative to each other. An arm driving base is disposed to move the first and second arms between a position at which the first and second arms oppose the cassette and a position at which the first and second arms oppose the processing section. The thickness of each of the first and second arms in the vertical direction is smaller than the first interval. The first and second arms can be set in an overlapping state, in which the first and second arms overlap each other in a horizontal direction, by the interval adjuster. By simultaneously operating the first and second arms, processed and unprocessed substrates can be exchanged at once in the cassette.

27 Claims, 20 Drawing Sheets

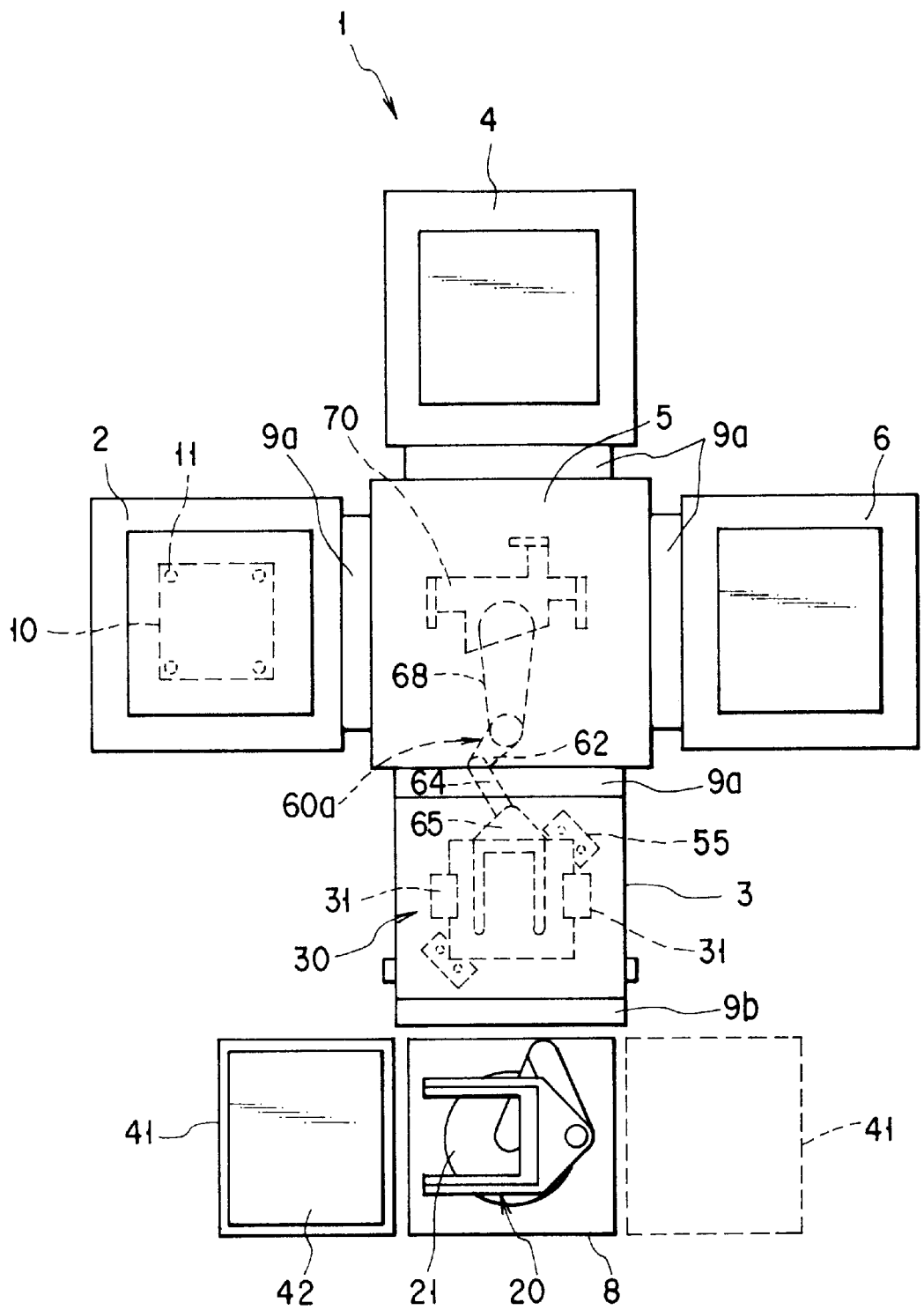
F I G. 2

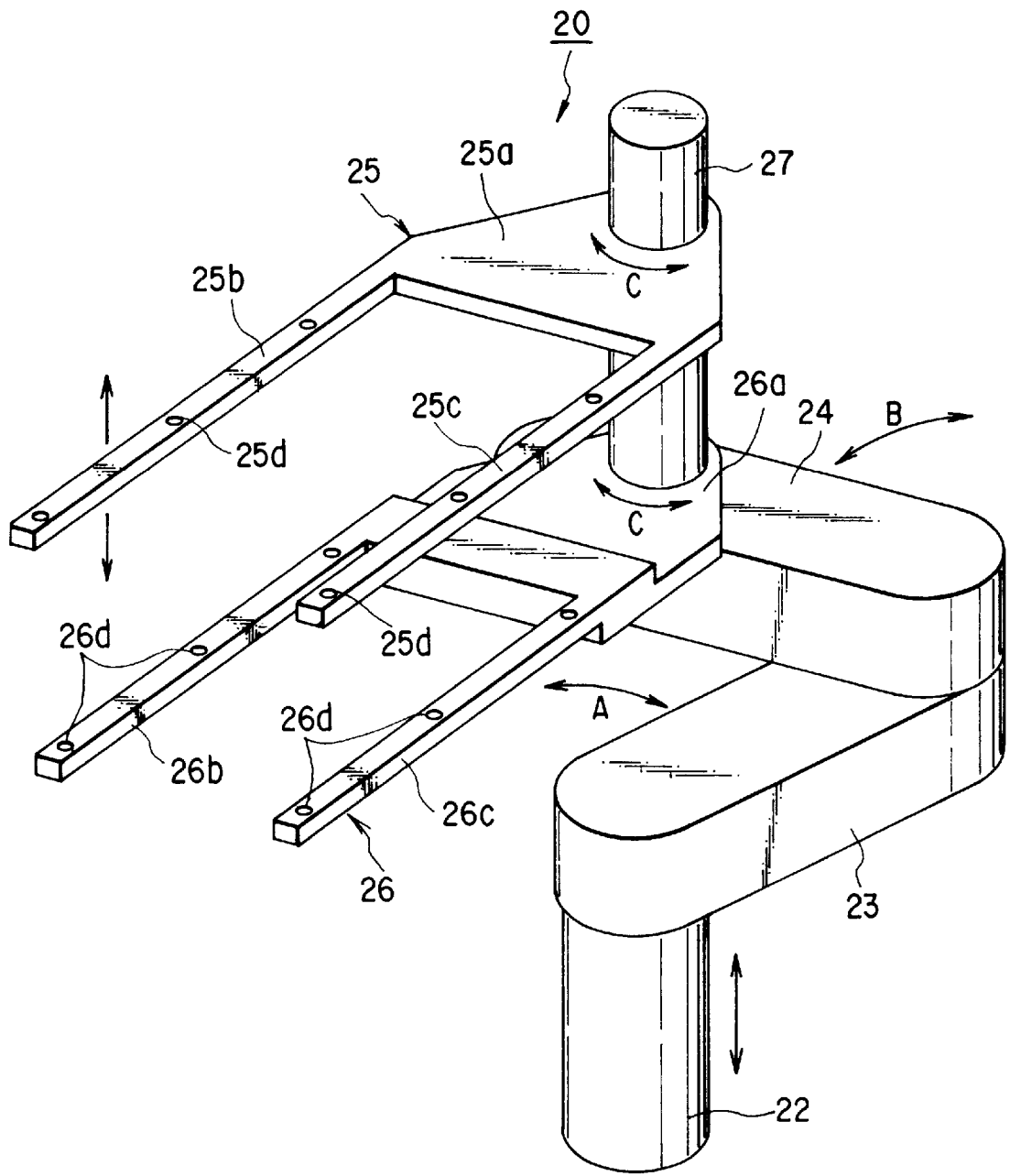
F I G. 3

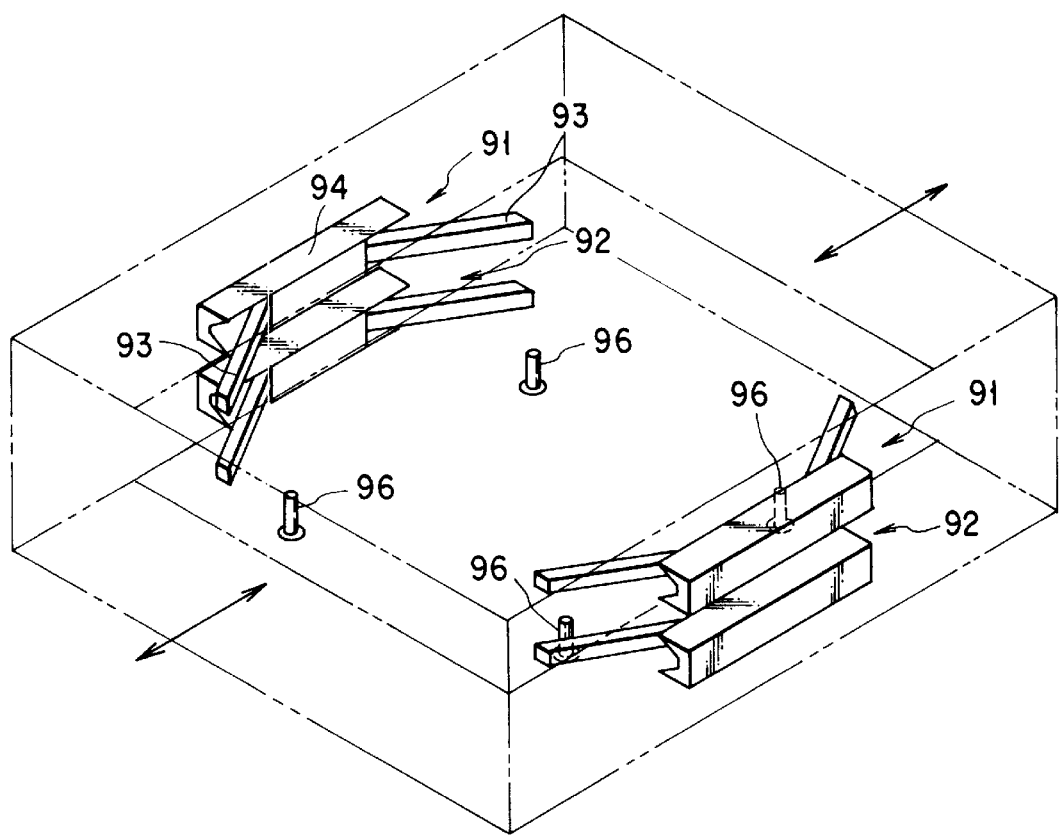
F I G. 31

5,989,346

SEMICONDUCTOR PROCESSING APPARATUS

BACKGROUND OF THE INVENTION

1. Field of the Invention

The present invention relates to a semiconductor processing apparatus for performing semiconductor processing on an LCD (Liquid Crystal Display) substrate or a semiconductor wafer. The semiconductor processing means various processing steps performed to fabricate semiconductor devices on target substrates such as LCD substrates and semiconductor wafers.

2. Description of the Related Art

Conventionally, an LCD substrate manufacturing process, for example, is done by using a so-called multi-chamber vacuum processing apparatus which includes a plurality of vacuum processing vessels for performing predetermined processing steps such as etching and ashing on LCD substrates.

This multi-chamber vacuum processing apparatus has a transfer chamber adjacent to the individual processing chambers via gate valves and a load-lock chamber adjacent to the transfer chamber via a gate valve. The apparatus further has an external transfer mechanism such as a transfer arm and an internal transfer mechanism. The external transfer mechanism unloads LCD substrates one by one from a cassette, which stores a large number of LCD substrates and is placed in an outer atmosphere, and transfers these LCD substrates to the load-lock chamber. The internal transfer mechanism transfers the LCD substrates between the load-lock chamber and the processing chambers.

This LCD substrate vacuum processing apparatus is required to process as large a number of substrates as possible within a predetermined time period, i.e., required to increase the throughput as high as possible. The apparatus is a multi-chamber apparatus in order to improve the throughput by processing a plurality of substrates at the same time.

The transfer system is also naturally required to improve the throughput. To this end, a mechanism having two arms, i.e., upper and lower arms for directly supporting LCD substrates is used as the external transfer mechanism. That is, the upper arm supports an unprocessed substrate and the lower arm supports a processed substrate.

To load a processed substrate into the cassette and unload the next unprocessed substrate from the cassette, the lower arm first enters a predetermined slot in the cassette, the entire transfer arm moves down a predetermined distance to load the processed substrate onto a supporting portion in the slot, and then the lower arm once leaves the cassette. Subsequently, the entire transfer arm moves up and the upper arm enters a predetermined slot. The entire transfer arm further moves up to allow the upper arm to support the unprocessed substrate placed on a supporting portion of the slot. The upper arm is then retreated from the cassette.

Unfortunately, the reduction of the time is limited even with the use of the above substrate loading/unloading operation, and so it is required to further improve the throughput.

Also, the following procedure is used to access a susceptor in a vacuum processing chamber by using two arms, i.e., upper and lower arms as the internal transfer mechanism. First, an unprocessed substrate is placed on the upper arm and the transfer arms are advanced into the vacuum processing chamber. The lower arm is moved forward to receive a processed substrate from the susceptor and then moved backward, and the upper arm is moved forward to transfer the unprocessed substrate onto the susceptor.

Even when this substrate exchange operation is performed, however, there is a certain limit on the shortening of the time. Therefore, a further improvement of the throughput is demanded.

SUMMARY OF THE INVENTION

It is, therefore, an object of the present invention to provide a semiconductor processing apparatus with a high throughput by improving the transfer efficiency of target substrates.

According to a first aspect of the present invention, there is provided a semiconductor processing apparatus comprising:

a storage section for storing a plurality of target substrates by vertically arranging the substrates at first intervals;

an external transfer mechanism for unloading the substrates from the storage section; and a processing section into which the substrates are loaded by the external transfer mechanism and which performs semiconductor processing for the substrates, wherein the external transfer mechanism comprises first and second arms defining first and second support surfaces each of which can support one of the substrates and capable of vertically moving relative to each other, an interval adjuster for adjusting an interval in a vertical direction between the first and second support surfaces by moving the first and second arms relative to each other, and an arm driving base for moving the first and second arms between a position at which the first and second arms oppose the storage section and a position at which the first and second arms oppose the processing section, and wherein a thickness in the vertical direction of each of the first and second arms is smaller than the first intervals, and the first and second arms can be set in an overlapping state, in which the first and second arms overlap each other in a horizontal direction, by the interval adjuster.

According to a second aspect of the present invention, there is provided a semiconductor processing apparatus comprising:

a storage section for storing a plurality of target substrates by vertically arranging the substrates;

an external transfer mechanism for unloading the substrates from the storage section; and a processing section into which the substrates are loaded by the external transfer mechanism and which performs semiconductor processing for the substrates, wherein the processing section comprises a work table for supporting one of the substrates, a first support member which can be selectively set in an advanced state for supporting one of the substrates in a first position above the work table and a retreated state, a second support member which can be selectively set in an advanced state for supporting one of the substrates in a second position above the work table and a retreated state, the first and second positions being so arranged as to be vertically stacked, and an internal transfer mechanism for loading and unloading the substrates onto and from the work table, the internal transfer mechanism comprising a transfer member having first and second holding portions each of which can hold one of the substrates and which are vertically stacked in correspondence with the first and second positions, and wherein with a first substrate as one of the substrates being held by the first holding portion of the transfer member and a second substrate as another one of the substrates being supported by the second support member, the first and second support members are vertically moved in opposite directions relative to the transfer member while the transfer member is positioned at a predetermined forward position above the work table, thereby transferring the first substrate from the first holding portion to the first support member and the second substrate from the second support member to the second holding portion.

According to a third aspect of the present invention, there is provided a semiconductor processing apparatus comprising:

a storage section for storing a plurality of target substrates by vertically arranging the substrates;

an external transfer mechanism for unloading the substrates from the storage section, the external transfer mechanism having first and second arms defining first and second support surfaces each of which can support one of the substrates and which are vertically stacked;

a first load-lock chamber that the first and second arms can access through a gate and which can be set in a reduced pressure atmosphere;

a transfer chamber which is connected to the first load-lock chamber via a gate and can be set in a reduced pressure atmosphere;

a first processing chamber which is connected to the transfer chamber via a gate and performs semiconductor processing in a reduced pressure atmosphere; and an internal transfer mechanism disposed in the transfer chamber to transfer the substrates between the first load-lock chamber and the first processing chamber, the internal transfer mechanism comprising a transfer member having first and second holding portions each of which can hold one of the substrates and which are vertically stacked, wherein the first load-lock chamber has first and second support levels each of which can support one of the substrates and which are vertically stacked, and comprises a plurality of support pins capable of vertically moving through the first and second levels and cooperating to support one of the substrates.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a schematic cross-sectional plan view showing the interior of the apparatus shown in FIG. 1;

FIG. 3 is a perspective view showing the state in which an upper fork and a lower fork are separated in an external transfer mechanism of the apparatus shown in FIG. 1;

FIG. 31 is a schematic perspective view showing the interior of a load-lock chamber of the apparatus shown in FIG. 28.

DETAILED DESCRIPTION OF THE PREFERRED EMBODIMENTS

Figure 1:
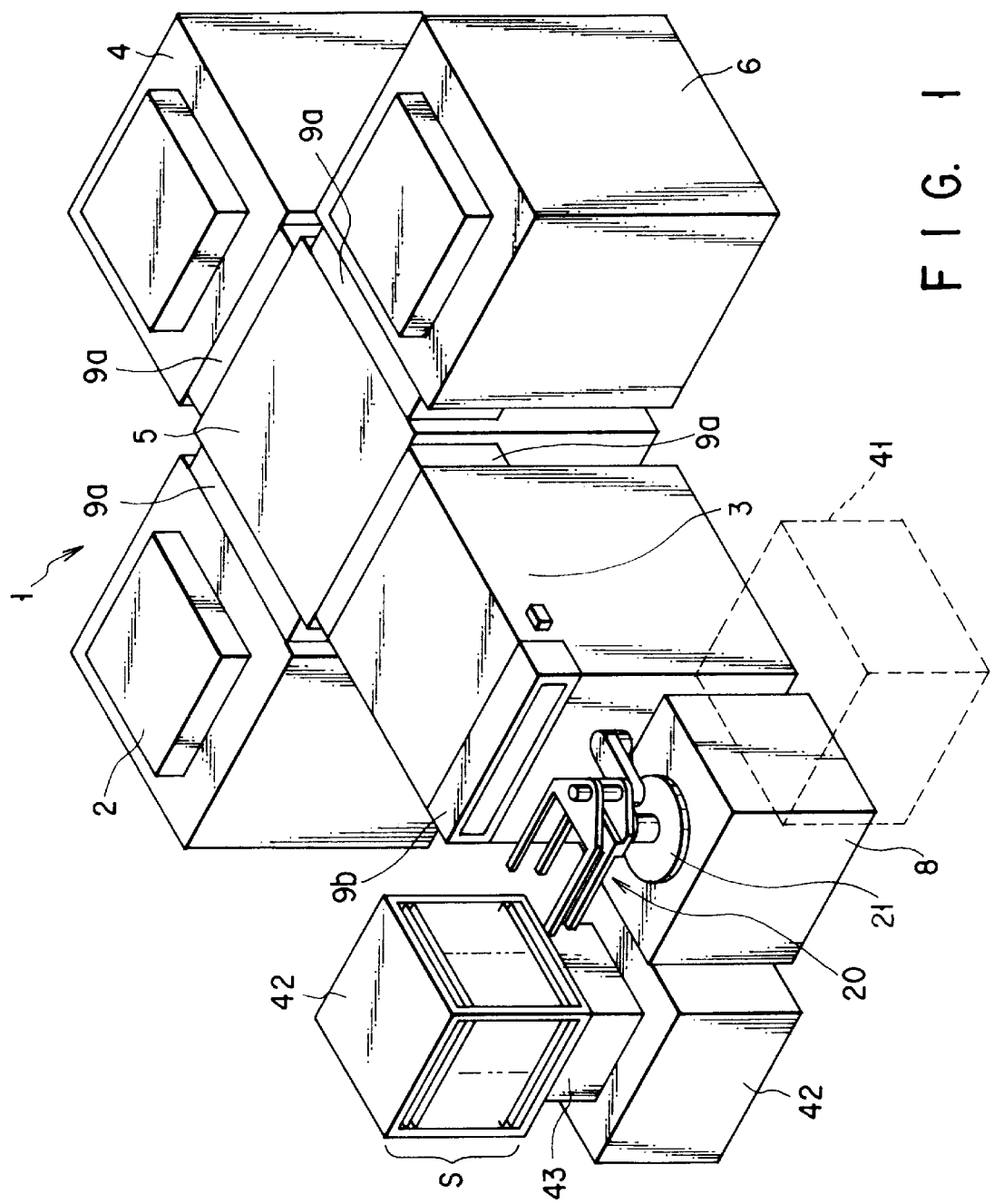
FIG. 1 is a perspective view showing the outline of a vacuum processing apparatus according to one embodiment of the present invention.

FIG. 1 is a perspective view showing the outline of a vacuum processing apparatus according to one embodiment of the present invention. FIG. 2 is a schematic cross-sectional plan view showing the interior of the apparatus.

A vacuum processing apparatus 1 according to this embodiment is a multi-chamber type apparatus so that the apparatus can perform etching processing and ashing processing for forming semiconductor devices on glass LCD substrates. In a central portion of the processing apparatus 1, a transfer chamber 5 and a load-lock chamber 3 connected via a gate valve 9a are disposed. The transfer chamber 5 has a substantially square planar shape. Three processing chambers 2, 4, and 6 are connected to side surfaces of the transfer chamber 5, except the side surface connected to the load-lock chamber 6, via gate valves 9a which airtightly seal the opening portions and are openable.

A supply means for supplying a predetermined processing gas and an exhausting means for exhausting a chamber are connected to each of the processing chambers 2, 4, and 6. Therefore, these processing chambers 2, 4, and 6 can be set and maintained in respective arbitrary reduced pressure atmospheres. For example, the same etching processing is performed in the processing chambers 2 and 6, and ashing processing is performed in the processing chamber 4. The combination of processing chambers is not limited to the one in this embodiment, i.e., any given processing steps can be combined. For example, it is possible to perform arbitrary processing steps such as serial processing and parallel processing by using a plurality of processing chambers.

A susceptor 10 for supporting an LCD substrate S on it is disposed in each of the processing chambers 2, 4, and 6. The susceptor 10 incorporates support pins 11 for vertically moving the substrate S. The substrate S is transferred to the supporting surface of the susceptor 10 by the cooperation of the support pins 11 and a transfer mechanism 60a disposed in the transfer chamber 5.

The load-lock chamber 3 is connected to the outer atmosphere via a gate valve 9b. A transfer mechanism 20 is disposed outside to oppose the gate valve 9b. The transfer mechanism 20 is placed on a mount 8 via a base 21.

As shown in FIG. 3, the transfer mechanism 20 has an elevating shaft 22 vertically movable on the base 21. A first arm 23 is connected to the elevating shaft 22 and can pivot about a portion near its one end portion with respect to the shaft 22 (a double-headed curved arrow A). A second arm 24 is connected to the first arm 23 and can pivot about a portion near its one end portion with respect to the first arm (a double-headed curved arrow B). A shaft 27 vertically extends from the second arm 24, and an upper fork 25 and a lower fork 26 for supporting the substrate S are fitted on the shaft 27. The upper and lower forks 25 and 26 rotate integrally with the shaft 27 in the rotating direction (a double-headed curved arrows C).

The lower fork 26 has two fingers 26b and 26c protruding parallel and horizontally at a predetermined distance from a proximal portion 26a. An appropriate number of contact members 26d which come in contact with a substrate to be supported and are made from, e.g., synthetic rubber elastic members or a synthetic resin, each having a high coefficient of friction are formed on the upper surface of each of the fingers 26b and 26c. These contact members 26d prevent the displacement or dropping of a substrate while the substrate is being supported.

The upper fork 25 has two fingers 25b and 25c protruding parallel and horizontally at a predetermined distance, which is larger than the distance between the two fingers of the lower fork 26, from a proximal portion 25a. A proper number of contact members 25d which come in contact with a substrate to be supported are formed on the upper surface of each of the fingers 25b and 25c. The thickness in the vertical direction of each of the upper and lower forks 25 and 26 is smaller than the interval (to be described later) at which the substrate S is stored in a cassette 42.

Figure 4:
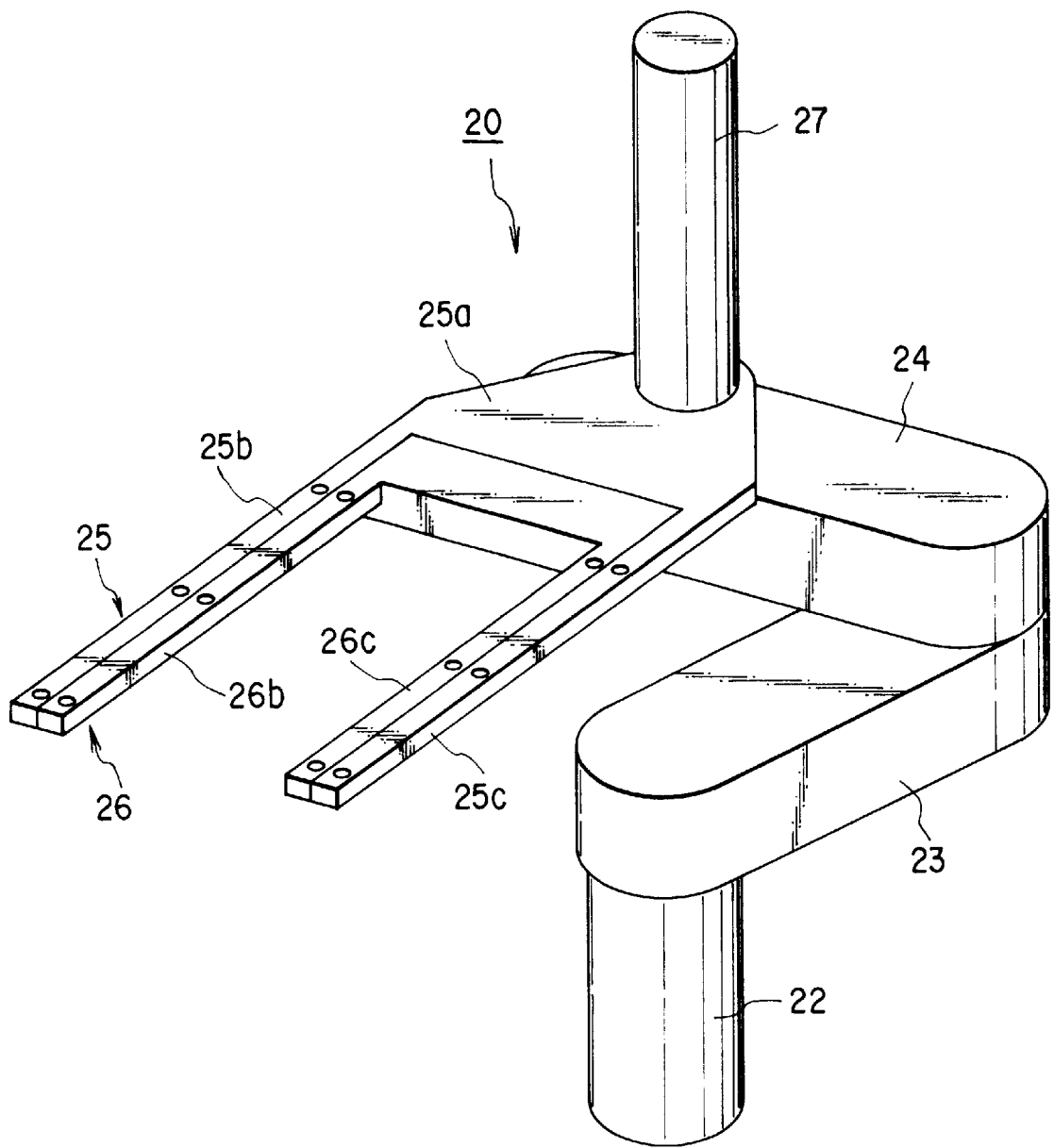
FIG. 4 is a perspective view showing the state in which the upper and lower forks overlap each other in the transfer mechanism shown in FIG. 3.

The upper fork 25 can vertically move along the shaft 27. When the upper fork 25 moves (descends) to the lowermost position, as shown in FIG. 4, the upper and lower forks 25 and 26 overlap each other in the horizontal direction. In this state, the fingers 25b and 25c of the upper fork 25 are positioned just outside the fingers 26b and 26c of the fork 26 on the same level (height) as the fork 26. Also, in this state, at least the top support surfaces of the two forks 25 and 26 are leveled with each other. Since the two forks 25 and 26 have the same thickness in this embodiment, both the top and bottom support surfaces of the forks 25 and 26 are leveled with each other.

The shaft 27 incorporates a driving mechanism for vertically moving the upper fork 25. As this driving mechanism, it is possible to use, e.g., a mechanism which slides the upper fork 25 by using a ball screw driven by a motor. To prevent particles from floating from the driving mechanism such as a ball screw to the atmosphere and contaminating a substrate, the atmosphere in the shaft 27 is constantly exhausted to the outside of the apparatus by a suction mechanism.

As a modification of the shaft 27, it is possible to use a shape, e.g., a rectangular parallelepiped, which covers a rectangular guide integrated with a ball screw. Also, to further smoothen and stabilize the vertical movement of the upper fork 25, a subguide can be extended vertically from behind the shaft 27 (on the side away from the fingers 25b and 25c).

A cassette indexer 41 is disposed on the side of the mount 8. The cassette 42 storing a predetermined number of (e.g., 25) substrates S (e.g., LCD glass substrates) is placed on the cassette indexer 41 via an elevating mechanism 43. The cassette 42 can be vertically moved and stopped at a given position by the elevating mechanism 43.

As shown in FIGS. 1 and 2, another cassette indexer 41 can also be arranged on the other side of the support table 8 away from the first cassette indexer 41. This arrangement realizes a proper exchange and transfer of unprocessed and processed substrates in accordance with the contents and time of the processing performed in each of the processing chambers 2, 4, and 6, thereby accomplishing a high throughput.

Figure 5:
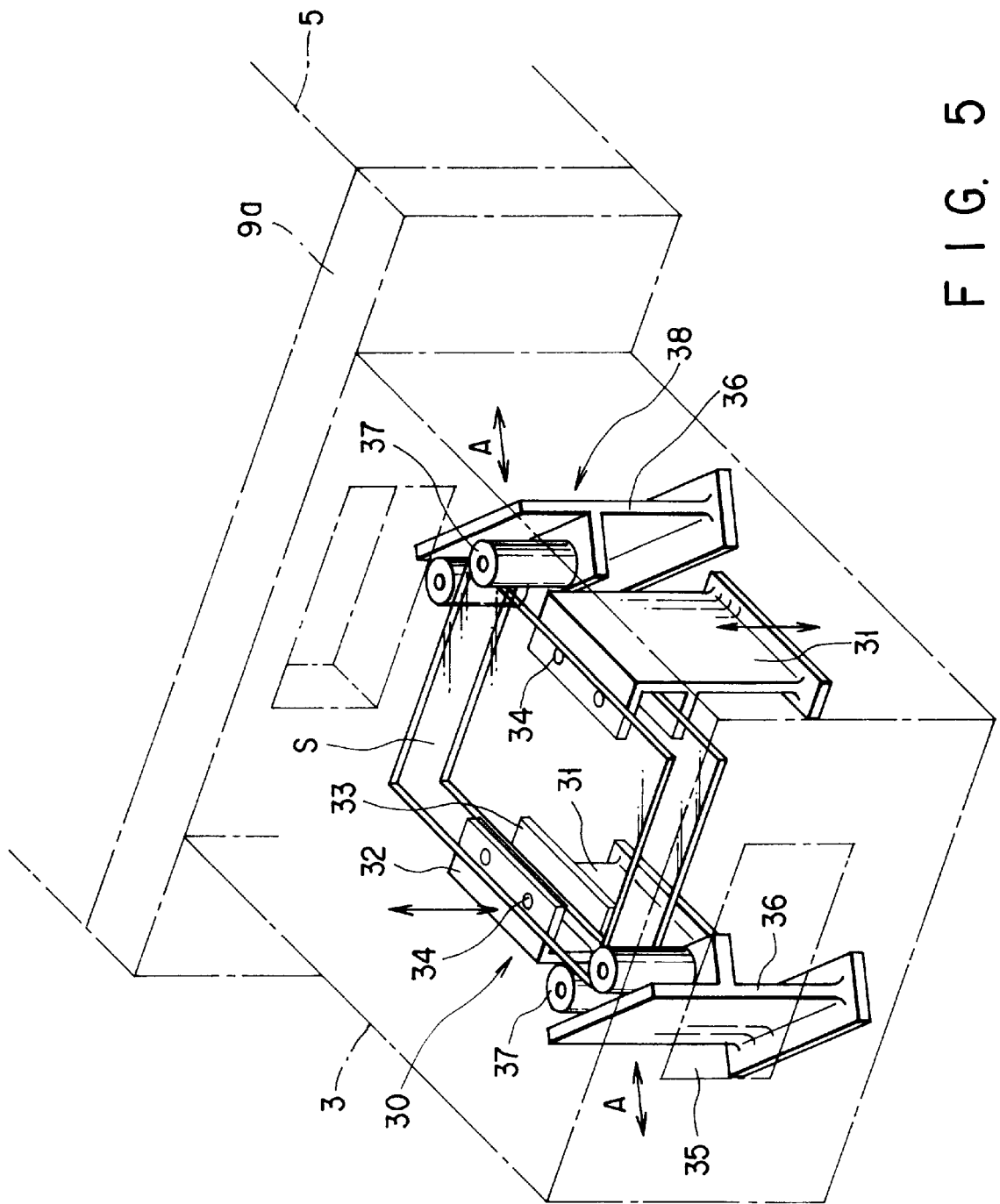
FIG. 5 is a perspective view showing a buffer rack and positioners disposed in a load-lock chamber of the apparatus shown in FIG. 1.

The load-lock chamber 3 can be set and maintained in an arbitrary reduced pressure atmosphere. As shown in FIG. 5, a buffer rack 30 having a pair of stands 31 for supporting the substrates S is disposed in the load-lock chamber 3. The buffer rack 30 is so designed as to hold two substrates S at once, improving the efficiencies of evacuation and purge.

Each stand 31 has two shelves, i.e., upper and lower shelves 32 and 33. The spacing between the shelves 32 and 33 is so set as to be smaller than the distance between the upper and lower forks 25 and 26 of the transfer mechanism 20, thereby forming two horizontal substrate support levels. In this embodiment, the support level interval in the buffer rack 30 is set to be larger than the support interval between the substrates S in the cassette 42. Projections 34 made of synthetic rubber with a high coefficient of friction are formed on the upper surface of each of the shelves 32 and 33. These projections 34 prevent the displacement and dropping of a substrate.

The pair of stands 31 of the buffer rack 30 can be integrally moved vertically. By the vertical movement of the buffer rack 30, one of two substrates can be selectively unloaded without vertically moving the transfer mechanism 60a provided in the transfer chamber 5.

In the load-lock chamber 3, a pair of positioners 35 for simultaneously aligning two substrates and an optical sensor (not shown) for checking the completion of the alignment of the substrates are arranged. The pair of positioners 35 are so arranged as to oppose each other on an extension line of the diagonal of a substrate. Each positioner 35 has a support 36 which can be moved in the directions of a double-headed arrow A in FIG. 5 and a pair of rollers 37 rotatably supported on the support 36.

The positioners 35 align two substrates supported by the buffer rack 30 by sandwiching the substrates in the direction of the diagonal line. The rollers 37 are particularly suitable to position substantially rectangular substrates because the rollers 37 position the substrates S by pushing four points on the side surfaces of the substrates. The rollers 37 are detachably mounted on the supports 36 and can be properly replaced in accordance with the size of an LCD target substrate.

The transfer chamber 5 can be set and maintained in an arbitrary reduced pressure atmosphere. The transfer mechanism 60a and a buffer frame 70 are disposed in the transfer chamber 5. The transfer mechanism 60a transfers substrates between the load-lock chamber 3 and the processing chambers 2, 4, and 6. As will be described later with reference to FIG. 20, the buffer frame 70 is so designed as to hold a plurality of LCD substrates. The buffer frame 70 temporarily holds unprocessed or processed substrates. Substrates are thus temporarily held, and this improves the throughput.

The transfer mechanism 60a has a first arm 62 pivotally disposed at one end portion of a base 68, a second arm 64 pivotally disposed in the distal end portion of the first arm 62, and a distal end arm 65 pivotally disposed on the second arm 64 and functioning as a transfer member for transferring a substrate. Unlike a transfer mechanism 60 to be described later with reference to FIG. 20, the distal end arm 65 supports only one substrate.

The operation of the vacuum processing apparatus 1 according to this embodiment will be described below.

First, the cassette 42 storing a plurality of unprocessed substrates, e.g., substrates S1 to S25 is placed on the cassette indexer 41. As shown in FIGS. 1 and 2, the transfer mechanism 20 faces the unloading opening of the cassette 42 and unloads the substrate S1 placed in the lowermost position. As shown in FIG. 4, the upper fork 25 moves down until its support surface and bottom surface are leveled with those of the lower fork 26, i.e., until the two forks are integrated.

Figure 6:
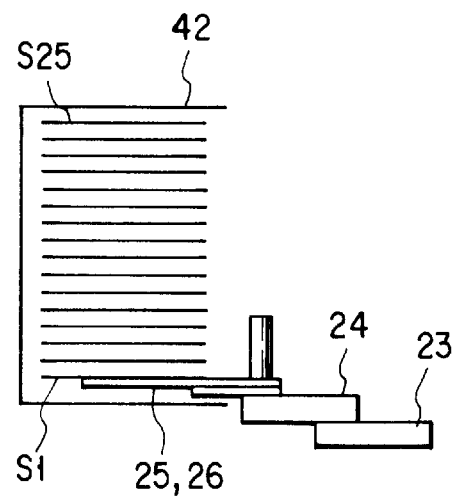
FIGS. 6 and 7 are views for explaining the way the transfer mechanism shown in FIG. 3 unloads an unprocessed substrate from a cassette.

In this state, the upper and lower forks 25 and 26 on the same support level enter the portion below the substrate S1 in the lowermost position, as shown in FIG. 6, by the pivoting movements of the first and second arms 23 and 24 and the upper and lower forks 25 and 26. During the operation, the elevating mechanism 43 of the cassette 42 adjusts relationship of the levels of the substrate S1 and the forks 25 and 26. Since the lowermost substrate S1 is usually processed first, the elevating mechanism 43 once raises the cassette 42 to a predetermined height and then gradually lowers the cassette 42. It is, of course, also possible to perform this level adjustment by using the elevating shaft 22 of the transfer mechanism.

When the upper and lower forks 25 and 26 on the same support level move forward to a predetermined position below the substrate S1, the entire transfer mechanism 20 is raised to a predetermined height by the elevating shaft 22.

Consequently, the upper and lower forks 25 and 26 support the substrate S1 whose peripheral portion is placed on the supporting portion in the cassette 42. Note that the cassette 42 itself may be lowered a predetermined distance. Thereafter, the upper and lower forks 25 and 26 are retreated from the cassette 42.

The upper and lower forks 25 and 26 of the transfer mechanism 20 supporting the substrate S1 enter the load-lock chamber 3, and the whole transfer mechanism 20 descends a predetermine distance to load the substrate S1 onto the upper shelves 32 of the stands 31. The upper and lower forks 25 and 26 then leave the load-lock chamber 3, and the load-lock chamber 3 is exhausted to a predetermined vacuum degree. Subsequently, the transfer mechanism 60a of the vacuum system unloads the substrate S1 and transfers it to a predetermined processing chamber, e.g., the processing chamber 6. There the substrate S1 is subjected to, e.g., etching processing.

In this embodiment, two substrates can be loaded into the load-lock chamber 3. Therefore, it is possible to perform the following operation instead of causing the upper and lower forks 25 and 26 on the same support level to unload the substrate S1. That is, the upper and lower forks 25 and 26 are moved forward into the cassette 42 while the upper fork 25 is stopped in a position higher by a predetermined distance (e.g., the interval at which the substrates S are stored in the cassette 42) than the lower fork 26. At the same time, the lower fork 26 supports the substrate S1, the upper fork 25 supports the substrate S2 positioned above the substrate S1, and the two substrates are simultaneously transferred to the load-lock chamber 3. This improves the throughput even in the initial state.

The vacuum processing apparatus 1 is a multi-chamber apparatus having the processing chambers 2, 4, and 6. In the early stages of the operation, therefore, unprocessed substrates are transferred one after another to the processing chambers 2 and 6 via the load-lock chamber 3 and the transfer chamber 5. Substrates completely etched in the processing chambers 2 and 6 are transferred to the processing chamber 4 for performing ashing processing via the transfer chamber 5. Accordingly, the transfer mechanism 20 exclusively performs only unloading and transfer of unprocessed substrates from the cassette 42 in the early stages.

Figure 7:
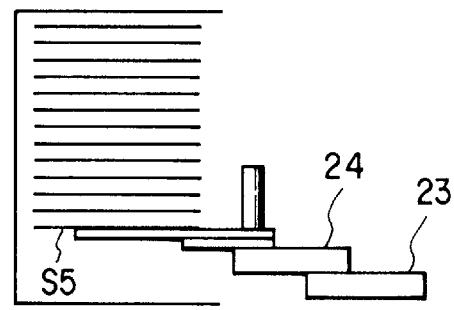
Figure 8:
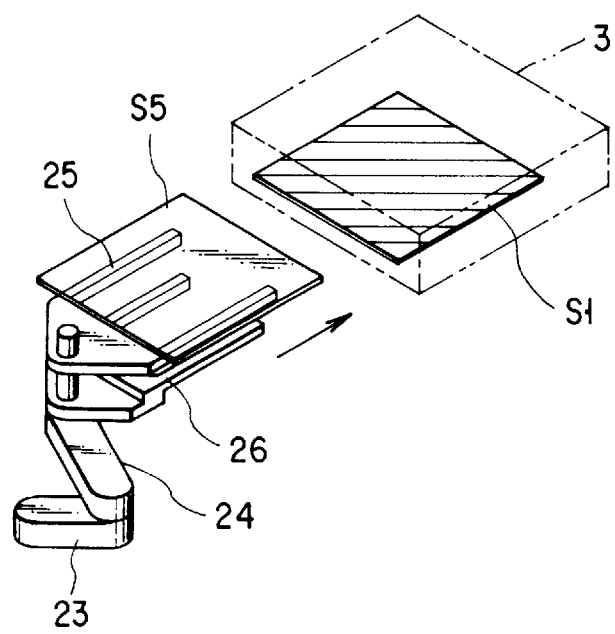
FIGS. 8 to 11 are views for explaining the way the transfer mechanism shown in FIG. 3 replaces a processed substrate with an unprocessed substrate in the load-lock chamber.

Assume that, as shown in FIG. 7, the fifth substrate S5 is unloaded and transferred to the load-lock chamber 3. In this state, if the processed substrate S1 is already placed in the lower buffer of the load-lock chamber 3 as shown in FIG. 8, the upper fork 25 is raised away from the lower fork 26 during, e.g., the transfer to the load-lock chamber 3. Consequently, the unprocessed substrate S5 is supported only by the upper fork 25.

Figure 9:
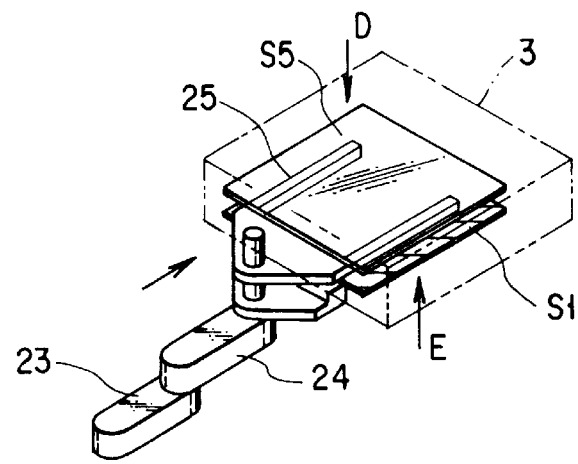

In this state, the upper and lower forks 25 and 26 are moved forward into the load-lock chamber 3, the upper fork 25 is entered into a portion above the upper shelf 32, and the lower fork 26 is entered into portion below the lower shelves 33. When the upper and lower forks 25 and 26 are moved to their respective predetermined positions, as shown in FIG. 9, the upper fork 25 is moved down (an arrow D) relative to the upper shelves 32, and the lower fork 26 is moved up (an arrow E) relative to the lower buffer. Consequently, the unprocessed substrate S5 is loaded onto the upper shelves 32 and at the same time the processed substrate S1 is supported by the lower fork 26. This operation is accomplished by the ascent of the elevating shaft 22 of the transfer mechanism 20 and the descent of the upper fork 25.

By this parallel exchange, it is possible to greatly reduce the time necessary to load an unprocessed substrate into the load-lock chamber 3 and unload a processed substrate from the load-lock chamber 3. This improves the throughput accordingly.

Figure 10:
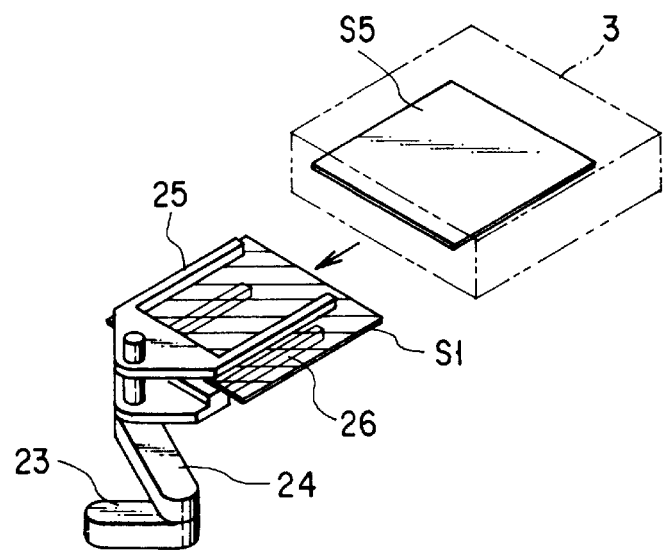
Figure 11:
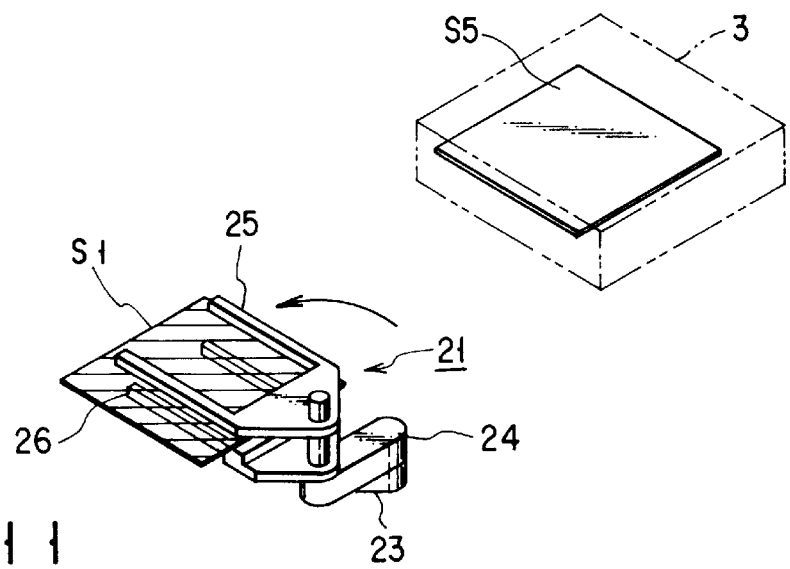
Figure 12:
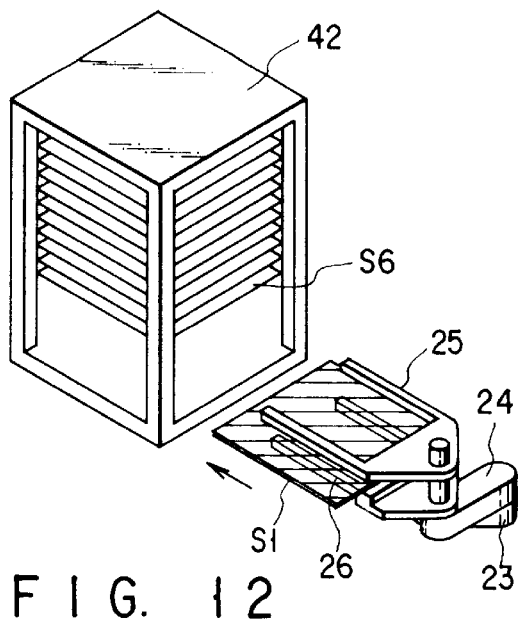
FIGS. 12 to 15 are views for explaining the way the transfer mechanism shown in FIG. 3 replaces a processed substrate with an unprocessed substrate in the cassette.

Thereafter, as shown in FIG. 10, the lower fork 26 supporting the processed substrate S1 and the upper fork 25 leave the load-lock chamber 3. The whole transfer mechanism 20 changes its direction as shown in FIG. 11, and so the upper and lower forks 25 and 26 face the cassette 42 as shown in FIG. 12.

Figure 13:
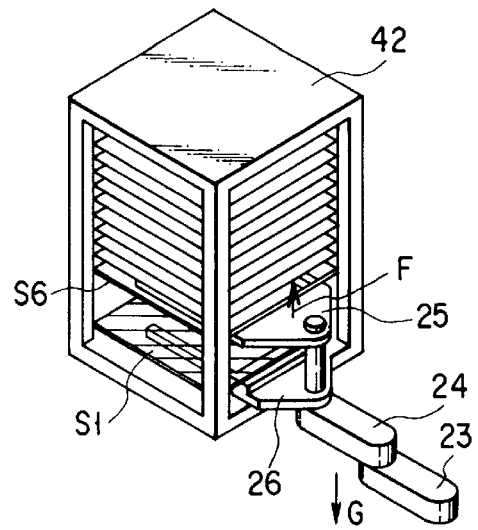

Subsequently, the lower fork 26 supporting the processed substrate S1 and the upper fork 25 enter the cassette 42 as shown in FIG. 13. That is, the lower fork 26 moves forward to a predetermined position above the lowermost supporting portion in the cassette 42, and the upper fork 25 moves forward to a predetermined position below the next unprocessed substrate S6.

Figure 14:
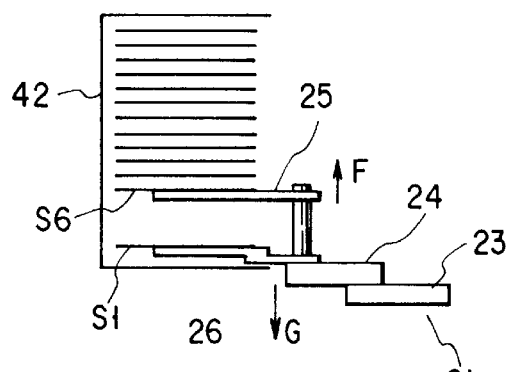

Thereafter, the upper fork 25 moves up (arrows F in FIGS. 13 and 14) relative to the cassette 42 (more specifically, relative to the substrate S6 to be unloaded). Meanwhile, the lower fork 26 supporting the processed substrate S1 moves down (arrows G in FIGS. 13 and 14) relative to the cassette 42 (more specifically, relative to the lowermost supporting portion). As a consequence, the unprocessed substrate S6 is supported by the upper fork 25 and at the same time the processed substrate S1 is loaded onto the lowermost supporting portion of the cassette 42. This operation is accomplished by the descent of the elevating shaft 22 of the transfer mechanism 20 and the ascent of the upper fork 25. Note that the cassette 42 may be raised by the elevating mechanism 43 instead of the descent of the elevating shaft 22.

By this parallel exchange, it is possible to greatly reduce the time necessary to load a processed substrate into the cassette 42 and unload an unprocessed substrate from the cassette 42. This improves the throughput accordingly.

Figure 15:
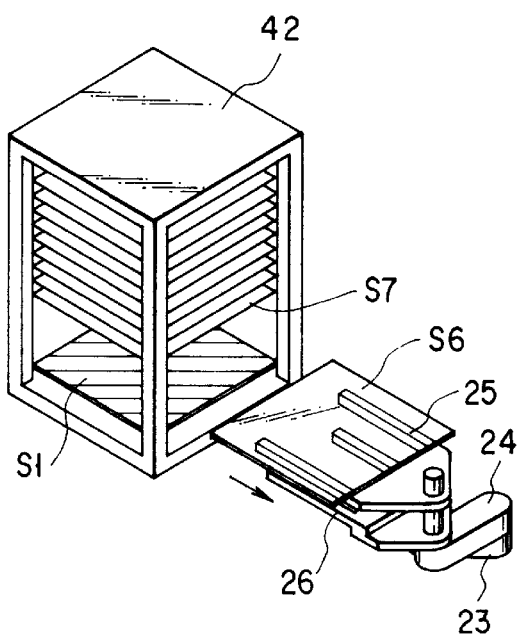

Thereafter, as shown in FIG. 15, the upper fork 25 supporting the unprocessed substrate S6 and the lower fork 26 leave the cassette 42. The upper and lower forks 25 and 26 are again transferred to the load-lock chamber 3, and the processed substrate S2 is replaced with the unprocessed substrate S6 by the already described parallel exchange in the load-lock chamber 3.

This parallel exchange of unprocessed and processed substrates done with the upper and lower forks 25 and 26 being separated is performed while unprocessed substrates remain in the cassette 42 (an intermediate state).

Figure 16:
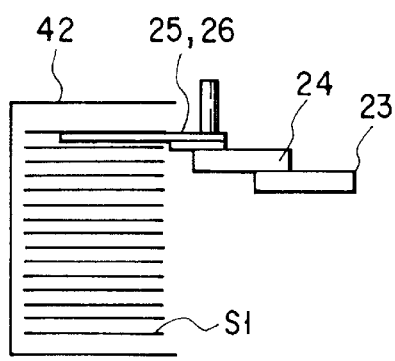
FIG. 16 is a view for explaining the way the transfer mechanism shown in FIG. 3 loads a processed substrate into the cassette.

When there is no more unprocessed substrate in the cassette 42 (a termination state), the upper fork 25 moves down to the same support level as the lower fork 26 as shown in FIG. 4, i.e., the two forks are again integrated. In this state, a processed substrate is unloaded from the load-lock chamber 3. As shown in FIG. 16, the processed substrate is transferred and loaded into the cassette 42.

In the vacuum processing apparatus 1 according to this embodiment as described above, the unloading of a processed substrate from the load-lock chamber 3 is performed in parallel with the loading of an unprocessed substrate into the load-lock chamber 3. Also, the unloading of an unprocessed substrate from the cassette 42 is performed in parallel with the loading of a processed substrate into the cassette 42. Accordingly, the time is shortened to nearly ½ the time required in conventional apparatuses in which loading and unloading are continuously performed by different operations. This greatly improves the throughput.

Note that in the above embodiment, the upper and lower forks 25 and 26 have the same thickness in the vertical direction and overlap each other in the horizontal direction when integrated (the state shown in FIG. 4). However, these forks may partially overlap each other. In either case, it is only necessary that the thickness be smaller than the interval at which the substrates S are arranged in the cassette 42. Consequently, the shapes of the upper and lower forks 25 and 26 constituting the substrate support can be freely designed. Therefore, a sufficient strength can be imparted even when the size of a substrate increases.

The transfer mechanism 20 has a so-called multi-joint structure in which each of the first and second arms 23 and 24 can pivot about a portion near its one end portion. Instead of this structure, it is also possible to use a transfer mechanism 80, shown in FIG. 17, including only one rotating system and a plurality of linear sliding systems.

The transfer mechanism 80 has a base plate 81, and a slider 82 is so disposed as to be slidable along the longitudinal direction (a double-headed arrow in FIG. 17) of the base plate 81. An L-shaped stand 83 is mounted on the slider 82 so that the stand 83 can rotate in the horizontal plane (a double-headed curved arrow M in FIG. 17). In addition, a horizontal plate 84 is attached to the vertical portion of the stand 83 so that the plate 84 can be moved in the vertical direction (a double-headed arrow N in FIG. 17).

Upper and lower forks 85 and 86 for supporting the substrates S on them are disposed on the horizontal plate 84. The lower fork 86 is so mounted on the horizontal plate 84 as to be slidable along the longitudinal direction of the horizontal plate 84. A substand 87 extends vertically from a proximal portion 86a of the lower fork 86, and the upper fork 85 is so attached to the substand 87 as to be vertically drivable. Accordingly, the upper fork 85 slides integrally with the lower fork 86 along the longitudinal direction of the horizontal plate 84.

Similar to the transfer mechanism 20, the upper and lower forks 85 and 86 of the transfer mechanism 80 can overlap each other like a single plate. Note that details of the transfer mechanism 80 will be described later with reference to FIG. 28.

When the transfer mechanism 80 with the above arrangement is used, it is possible to simultaneously perform the loading of a processed substrate into the cassette 42 and the unloading of an unprocessed substrate from the cassette, and this improves the throughput. Since the transfer mechanism 80 includes only one rotating system and all the other systems are linear sliding systems, the mechanism 80 can perform a high-speed stable operation.

In the semiconductor processing apparatus of this embodiment as described above, the loading of a processed substrate into the storage and the unloading of an unprocessed substrate from the storage can be performed in parallel with each other. Accordingly, the throughput can be greatly improved. In addition, this apparatus can perform continuous processing of etching and ashing, and this also increases the efficiency. Furthermore, the apparatus can perform various processing steps meeting the user's needs, e.g., continuous etching-etching processing and single etching processing, by changing the program. This makes the apparatus extremely versatile.

Figure 17:
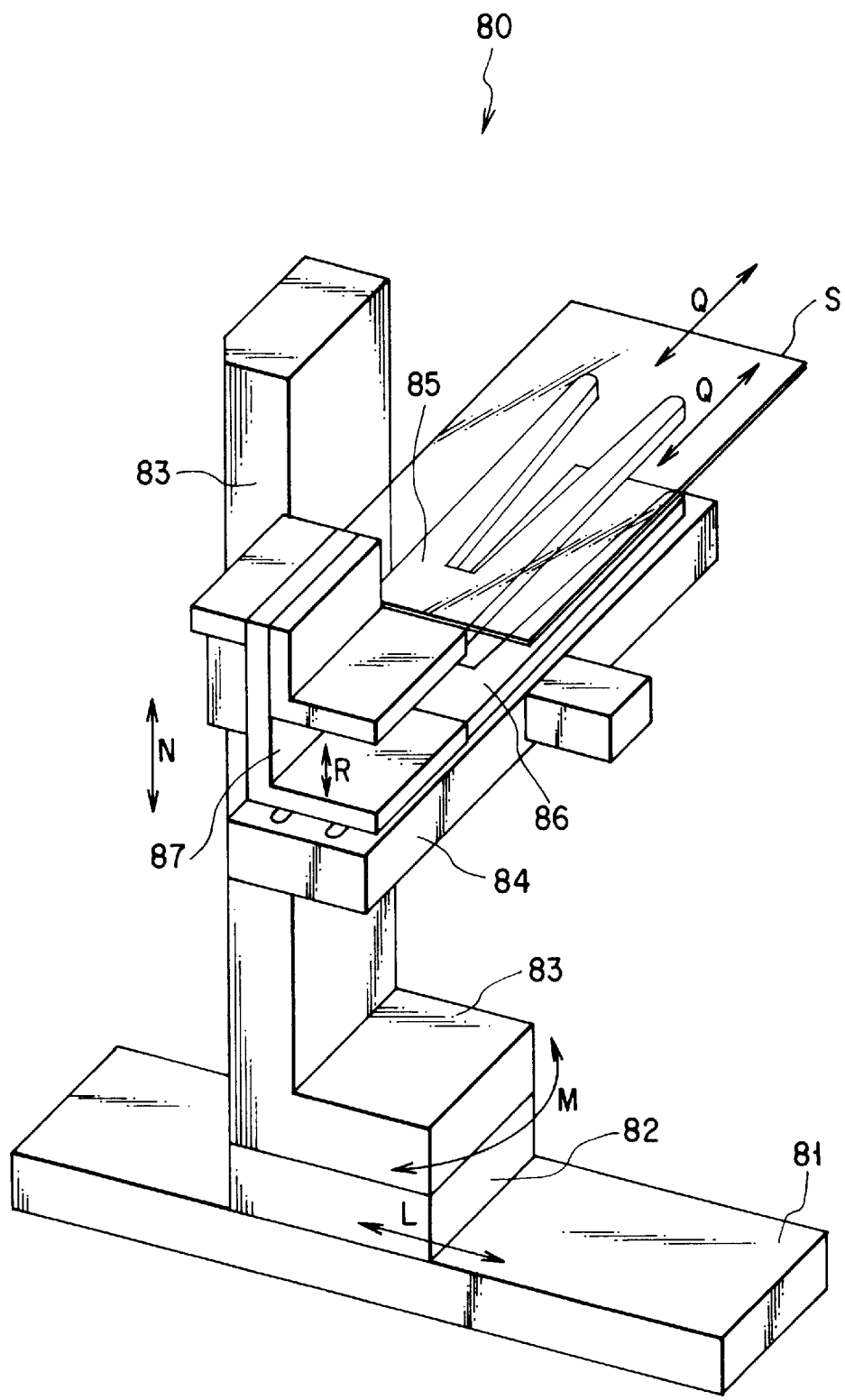
FIG. 17 is a perspective view showing an external transfer mechanism according to a modification of the present invention.
Figure 18:
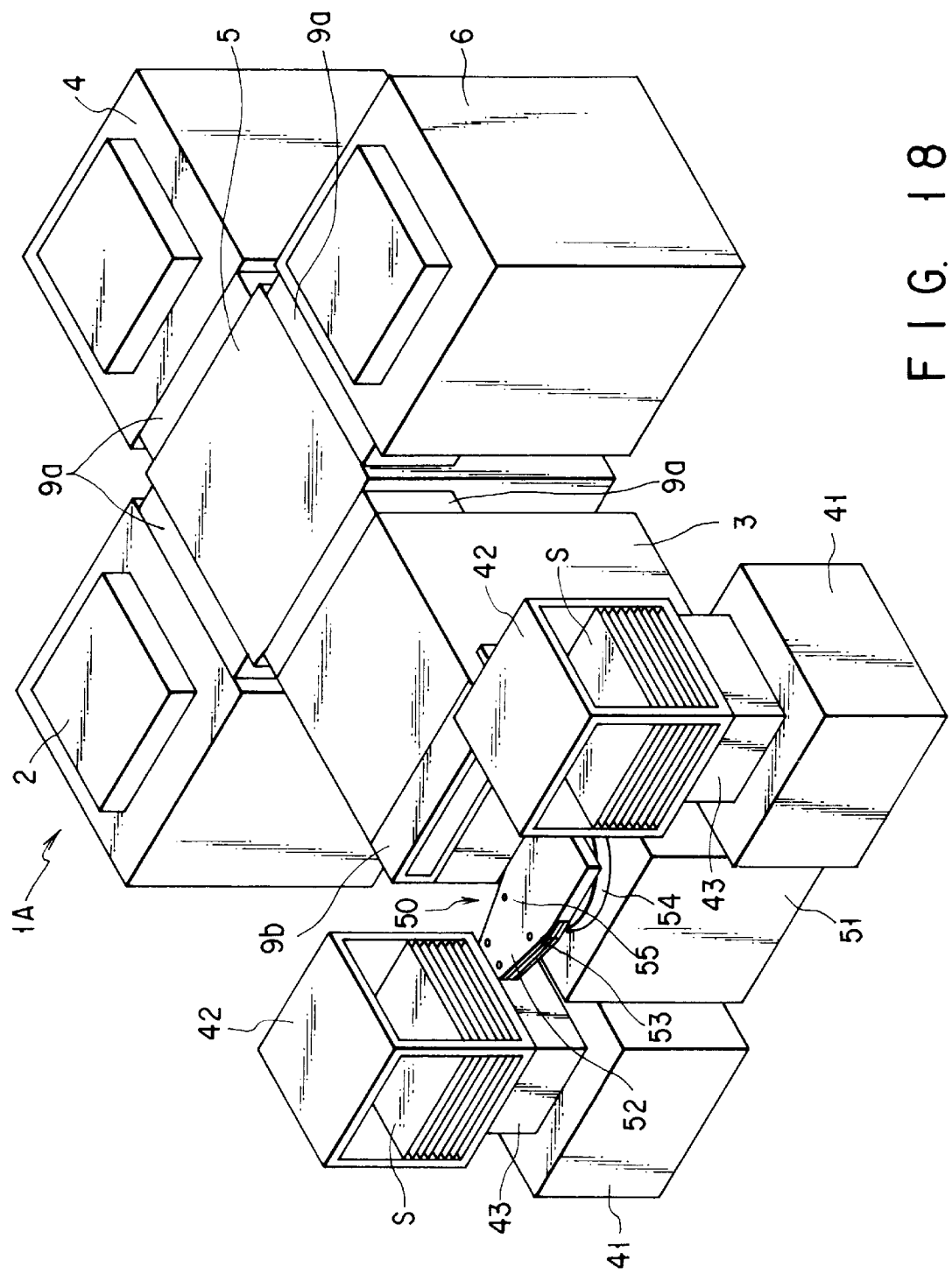
FIG. 18 is a perspective view showing the outline of a vacuum processing apparatus according to another embodiment of the present invention.
Figure 19:
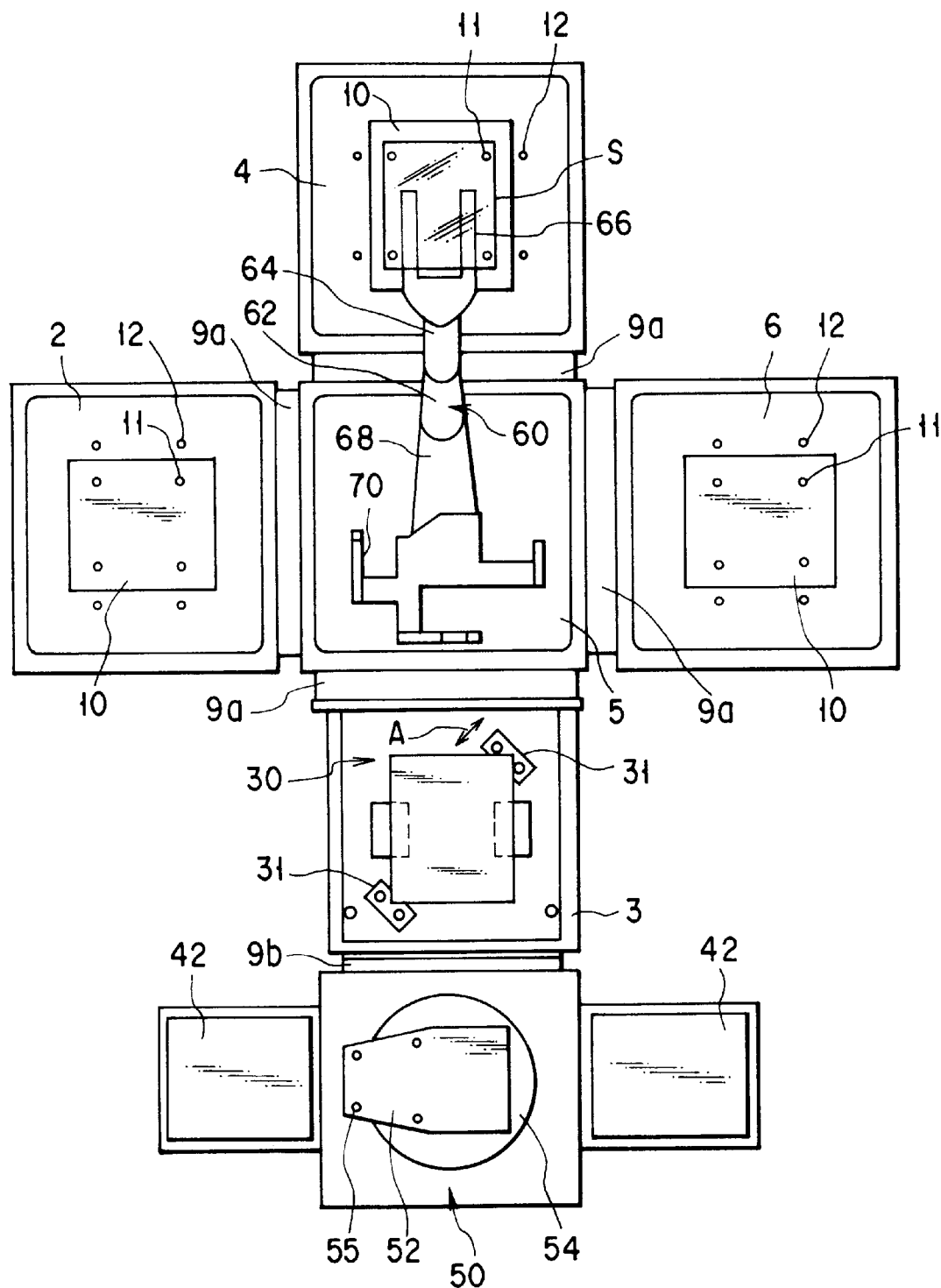
FIG. 19 is a schematic cross-sectional plan view showing the interior of the apparatus shown in FIG. 18.

FIG. 18 is a perspective view showing the outline of a vacuum processing apparatus according to another embodiment of the present invention. FIG. 19 is a schematic cross-sectional plan view showing the interior of the apparatus. The same reference numerals as in the previous embodiment described with reference to FIGS. 1 to 17 denote the same parts in FIGS. 18 and 19, and a detailed description thereof will be omitted.

A vacuum processing apparatus 1A according to this embodiment is also a multi-chamber apparatus so that the apparatus can perform etching processing and ashing processing for forming semiconductor devices on glass LCD substrates. That is, as shown in FIG. 18, this apparatus includes three processing chambers 2, 4, and 6 like in the previous embodiment. A supply means for supplying a predetermined gas and an exhausting means for exhausting a chamber are connected to each of the processing chambers 2, 4, and 6. Accordingly, the processing chambers 2, 4, and 6 can be set and maintained in respective arbitrary reduced pressure atmospheres. For example, the same etching processing is performed in the processing chambers 2 and 6, and ashing processing is performed in the processing chamber 4. The combination of processing chambers is not restricted to this one, and so appropriate processing steps can be combined. That is, it is possible to perform arbitrary processing steps such as serial processing and parallel processing by using a plurality of processing chambers.

A susceptor 10 is disposed in each of the processing chambers 2, 4, and 6. Four support pins 11 for supporting a substrate S are arranged on the susceptor 10. In this embodiment, four support members 12 for supporting a substrate are also arranged around the susceptor 10 in addition to the support pins 11. Details of the support pints 11 and the support members 12 will be described later.

Figure 21:
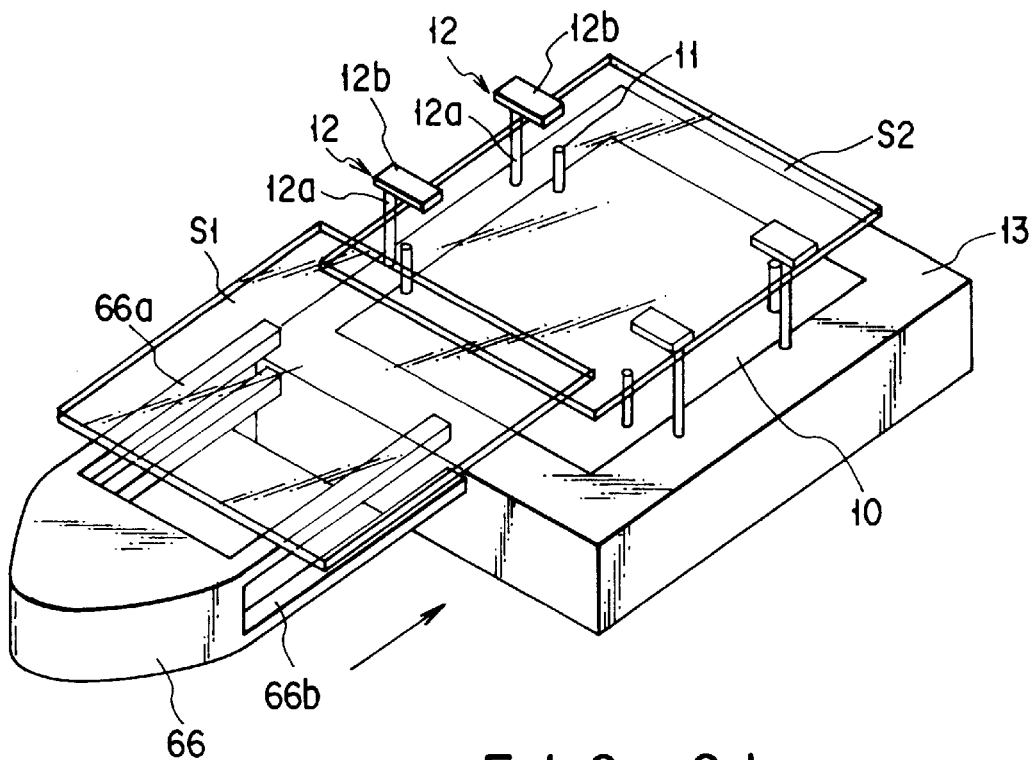
FIGS. 21 to 24 are views for explaining a substrate exchange operation in a processing chamber of the apparatus shown in FIG. 18.

A load-lock chamber 3 has a construction similar to that of the load-lock chamber of the previous embodiment described with reference to FIG. 21. That is, the load-lock chamber 3 can be set and maintained in a given reduced pressure atmosphere. In the load-lock chamber 3, a buffer rack 30 including a pair of stands 31 for supporting the substrate S is disposed. The buffer rack 30 is so designed as to hold two substrates S at once, and this improves the efficiency of evacuation and purging. Also, a pair of positioners 35 for simultaneously aligning two substrates and an optical sensor (not shown) for checking the completion of the alignment of the substrates are arranged in the load-lock chamber 3.

The load-lock chamber 3 is connected to the outer atmosphere via a gate valve 9b. Two cassette indexers 41 are disposed outside the load-lock chamber 3. Cassettes 42 storing LCD substrates are placed on these cassette indexers 41, respectively. One of these cassettes 42 stores unprocessed substrates and the other stores processed substrates. Each cassette 42 can be vertically moved by an elevating mechanism 43.

A substrate transfer mechanism 50 is disposed on a mount 51 between the two cassettes 42. The transfer mechanism 50 has two arms, i.e., upper and lower arms 52 and 53 and a base 54 which supports these arms 52 and 53 so that the arms can integrally move back and forth and rotate. Four projections 55 for supporting a substrate are formed on each of the arms 52 and 53. These projections 55 are made from a synthetic rubber elastic material having a high coefficient of friction and prevent the displacement and dropping of a substrate while the substrate is being supported.

The transfer mechanism 50 can transfer two substrates at once by using the arms 52 and 53. That is, two substrates can be simultaneously unloaded from or loaded into the cassette 42. The level of each cassette 42 is adjusted by the elevating mechanism 43, and this sets the position of unloading or loading of substrates done by the arms 52 and 53. The spacing between the two arms 52 and 53 is so set as to be larger than the maximum value of intervals at which substrates are supported in various cassettes. Accordingly, various cassettes can be used.

Note that it is also possible to arrange only one cassette. If this is the case, processed substrates are returned to empty spaces in the same cassette.

Figure 20:
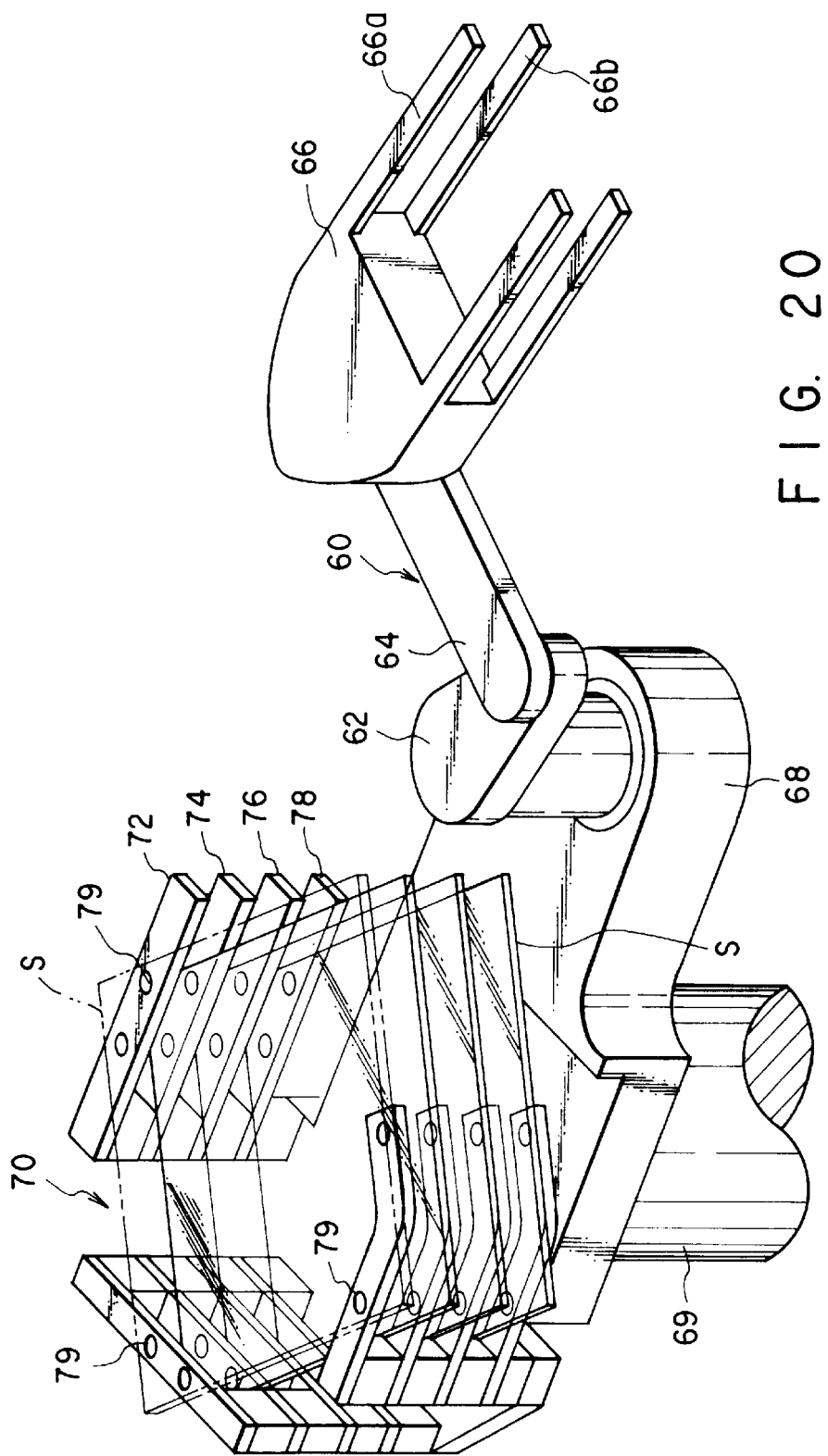
FIG. 20 is a perspective view showing a transfer mechanism and a buffer frame disposed in a transfer chamber of the apparatus shown in FIG. 18.

A transfer chamber 5 can be set and maintained in an arbitrary reduced pressure atmosphere. As shown in FIG. 20, a transfer mechanism 60 and a buffer frame 70 capable of holding a plurality of LCD substrates are disposed in the transfer chamber 5. The transfer mechanism 60 transfers substrates between the load-lock chamber 3 and the processing chambers 2, 4, and 6. The buffer frame 70 temporarily holds unprocessed or processed substrates. The throughput is improved by temporarily holding substrates in this way.

The transfer mechanism 60 has a first arm 62 pivotally disposed in one end of a base 68, a second arm 64 pivotally disposed in a distal end portion of the first arm 62, and a catcher 66 which is pivotally disposed on the second arm 64 and holds a substrate. A substrate can be transferred by moving the first arm 62, the second arm 64, and the catcher 66 by using a driving mechanism incorporated into the base 68. The transfer mechanism 60 can be vertically moved by a cylinder mechanism 69 disposed below the base 68 and can also be rotated about the cylinder.

The catcher 66 of the transfer mechanism 60 has two forks 66a and 66b. The upper fork 66a supports an unprocessed substrate, and the lower fork 66b supports a processed substrate. Although not shown, projections made of synthetic rubber with a high coefficient of friction are formed on each fork to prevent the displacement and dropping of a substrate.

The buffer frame 70 is disposed in the other end of the base 68 so as to be vertically movable with respect to the base 68. The frame 70 includes four buffers 72, 74, 76, and 78 which form four horizontal substrate support levels. Projections 79 for supporting a substrate are formed on these buffers. These projections 79 are made of synthetic rubber with a high coefficient of friction and prevent the displacement or dropping of a substrate while the substrate is being supported.

The transfer mechanism 60 and the buffer frame 70 rotate integrally with the base 68 about the cylinder 69. By rotating the base 68 in this manner, the transfer chamber 60 can be selectively opposed to any of the processing chambers 2, 4, and 6 and the load-lock chamber 3.

As described above, the susceptor 10 is disposed in each of the processing chambers 2, 4, and 6. The susceptor 10 functions as a lower electrode for forming a plasma. As shown in FIG. 21, a ceramic shield ring 13 is disposed around the susceptor 10. The four support pins 11 (second support members) are so arranged as to be able to advance and retreat near the edges of the susceptor 10. Each of the four support members 12 (first support members) has a support rod 12a and an extending member 12b. The support rod 12a is so arranged as to be able to advance and retreat in the shield ring 13 around the susceptor 10. The extending member 12b is attached to the distal end portion of the support rod 12a. These support rods 12a can support a substrate in an advancing state. When receiving a substrate, the support rods 12a support an unprocessed substrate S1 in a first position. Likewise, the support pins 11 can support a substrate in an advancing state. When transferring a substrate, the support pins 11 support a processed substrate S2 in a second position lower than the first position.

Figure 25A:
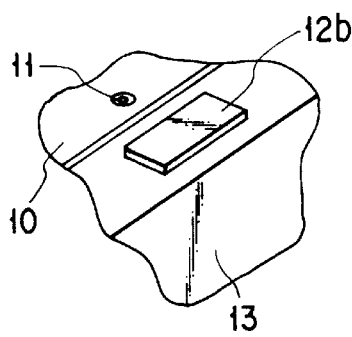
FIGS. 25A and 25B are views showing the operation of support members which support an unprocessed substrate in the processing chamber of the apparatus shown in FIG. 18.
Figure 25B:
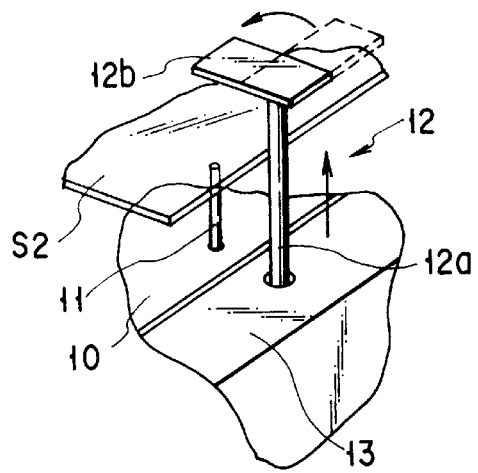

When retreated, as shown in FIG. 25A, the extending member 12b of the support member 12 does not extend to the susceptor 10. However, when the support member 12 is in a support position as shown in FIG. 25B, the support rod 12a is rotated to project the extending member 12b above the susceptor 10.

The level of the catcher 66 is so set that the upper fork 66a is leveled with the first position and the lower fork 66b is leveled with the second position. As will be described later, when the catcher 66 is inserted into a processing chamber while an unprocessed substrate is being supported on the upper fork 66a, the unprocessed substrate is transferred to the support members 12 in the first position and at the same time a processed substrate supported by the support pins 11 is transferred to the fork 66b in the first position.

The operation of the apparatus with the above construction will be described below.

First, the two arms 52 and 53 of the transfer mechanism 50 are moved back and forth to simultaneously transfer two substrates S from one of the cassettes 42 (the left cassette in FIG. 18) storing unprocessed substrates into the load-lock chamber 3.

In the load-lock chamber 3, the two substrates S are held by shelves 32 and 33 of the buffer rack 30. After the arms 52 and 53 leave the load-lock chamber 3, the gate valve 9b in the outer atmosphere of the load-lock chamber 3 is closed. Thereafter, the load-lock chamber 3 is exhausted to a predetermined vacuum degree, e.g., about $10^{-1}$ Torr. After the evacuation, four rollers 90 of the pair of positioners 35 are pushed against the substrates S to position these substrates.

After the substrates S are thus positioned, the gate valve 9a between the transfer chamber 5 and the load-lock chamber 3 is opened. To prevent contamination, the substrate S on the lower shelves 33 is first transferred into the transfer chamber 5 by the transfer mechanism 60 and held in the uppermost buffers 72 of the buffer frame 70. Since the substrates S are supported at predetermined intervals in the buffer rack 30, the operation of the transfer mechanism can be controlled independently of the substrate support interval in the cassette 42. That is, it is unnecessary to use a complicated control means which changes the movement or the like of the transfer mechanism 50 for each of different substrate support intervals. Consequently, contamination in the apparatus can be reduced.

After the substrate is loaded into the transfer chamber 5, the chamber is further exhausted to about $10^{-4}$ Torr. This reduces contamination in the apparatus. Subsequently, the substrate S loaded into the transfer chamber 5 by the transfer mechanism 60 and held by the buffer 72 is transferred to a predetermined processing chamber, e.g., the processing chamber 2. Except when a substrate is transferred for the first time, a processed substrate exists in a processing chamber, and so the processed and unprocessed substrates are exchanged.

This operation of exchange will be described below with reference to FIGS. 21 to 24.

First, with the processed substrate S2 placed on the susceptor 10 in the processing chamber, the support members 12 are advanced from the state shown in FIG. 25A. In addition, as shown in FIG. 25B, the support rods 12a are rotated to project the extending members 12b toward the susceptor 10. In this state, the support members 12 can receive the unprocessed substrate S1 in the first position.

Subsequently, the support pins 11 are advanced to raise the processed substrate S2 and support the substrate in the second position. The state shown in FIG. 21 is formed by the above operation. In this state, the level of the catcher 66 of the transfer mechanism 60 is so set that the upper fork 66a is leveled with the first position and the lower fork 66b is leveled with the second position. The upper fork 66a is supporting the unprocessed substrate S1.

Figure 22:
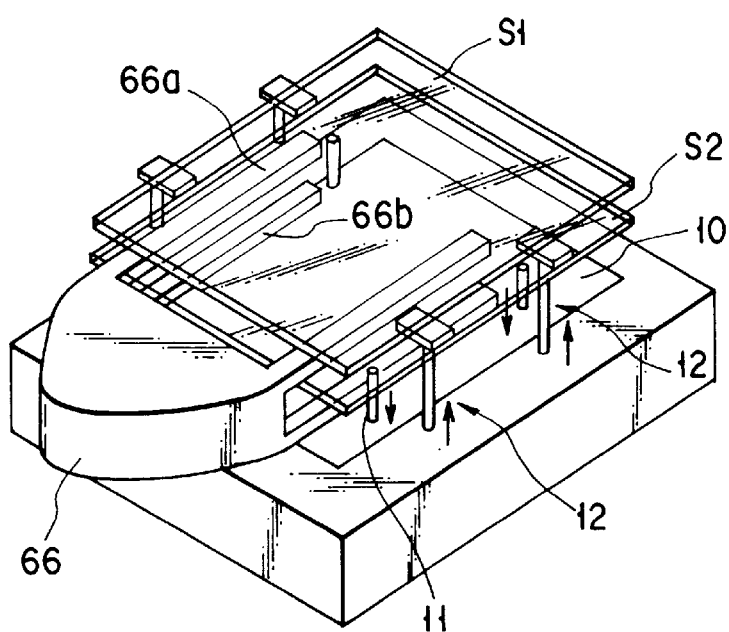

As shown in FIG. 22, the catcher 66 is moved forward to the position above the susceptor 10 to transfer the unprocessed substrate S1 to the first position above the susceptor 10. In this state, the fork 66b is positioned immediately below the processed substrate S2 in the second position. From this state, the support rods 12a of the support members 12 are slightly raised and at the same time the support pins 11 are lowered. Consequently, the unprocessed substrate S1 is supported by the support members 12 and the processed substrate S2 is supported by the lower fork 66b of the catcher 66.

Figure 23:
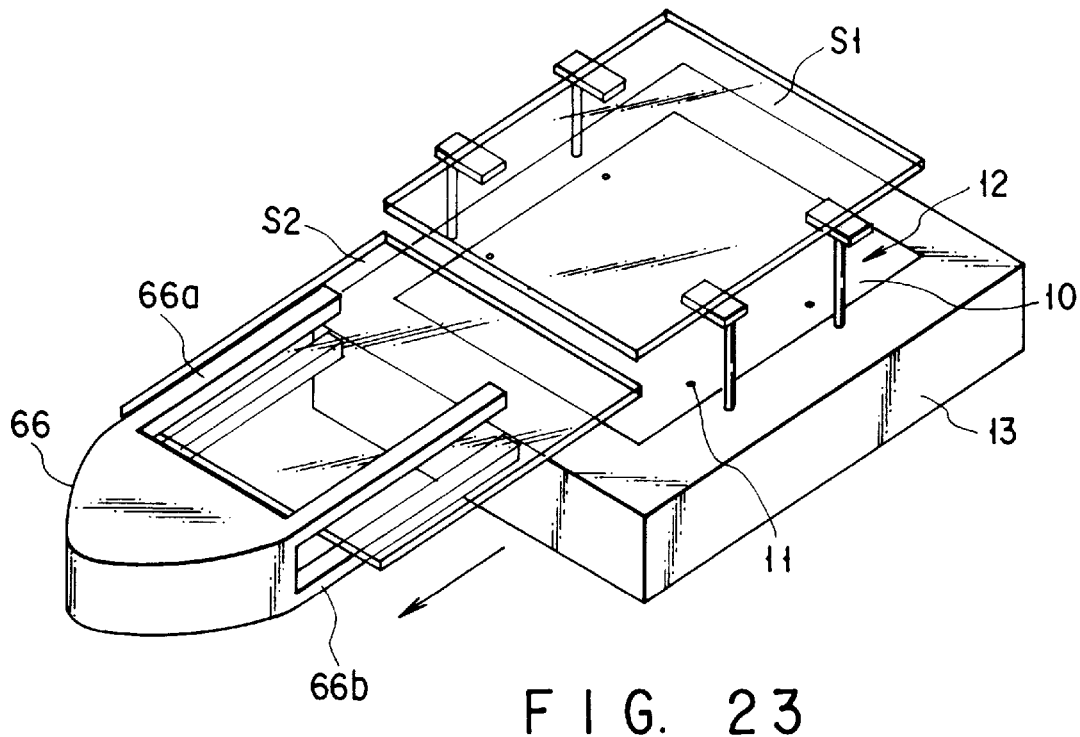
Figure 24:
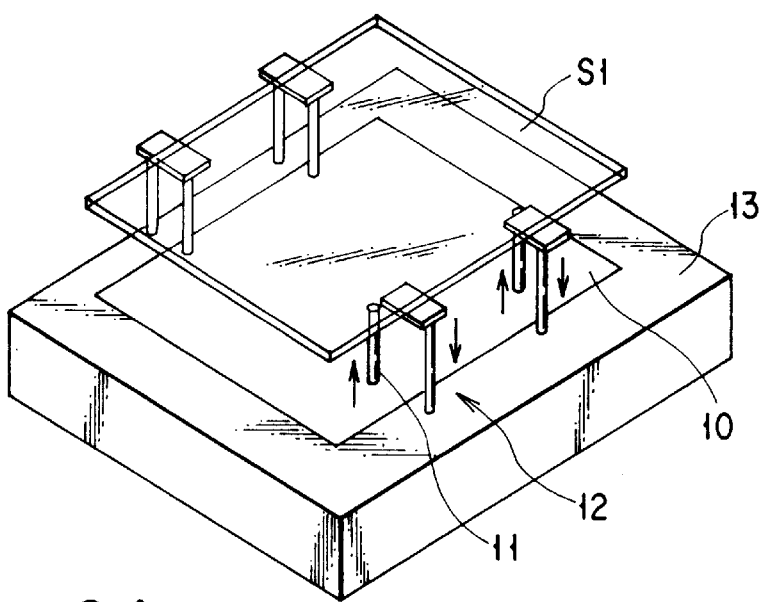

Thereafter, as shown in FIG. 23, the catcher 66 supporting the processed substrate S2 is moved backward. As shown in FIG. 24, the support pins 11 are again advanced to support the unprocessed substrate S1, and the support members 12 are retreated and returned to the state shown in FIG. 25A. In parallel with this operation shown in FIG. 24, the gate valve 9a between the processing chamber and the transfer chamber 5 is closed to start pre-processing. Therefore, the operation shown in FIG. 24 has no influence on the throughput.

As described above, when substrates are exchanged in a processing chamber, the loading of an unprocessed substrate and the unloading of a processed substrate can be performed by moving the holding unit (catcher) once. This greatly reduces the time required to exchange substrates. In practice, the time required for this exchange was reduced to 8 seconds which was less than half of 17 seconds in conventional apparatuses.

While the above operation is being performed, the substrate on the shelves 32 of the load-lock chamber 3 is loaded into the transfer chamber 5 and held in given buffers. This operation is sequentially performed for the substrates stored in the cassette 42. Consequently, the substrates can be loaded into the apparatus without being waited because the load-lock and transfer chambers 3 and 5 have the buffers, and this improves the throughput.

The processed substrate S2 is returned to the transfer chamber 5 by the transfer mechanism 60. The substrate S2 is then transferred through the load-lock chamber 3 and inserted into the cassette 42 (the right cassette in FIG. 18) for processed substrates by the arms 52 and 53 of the transfer mechanism 50.

In the above processing, an extremely high throughput impossible in any conventional apparatus can be realized by the existence of the buffer mechanism and the high efficiency of substrate exchange in particularly the processing chamber.

Additionally, the above apparatus can perform continuous processing of etching and ashing, and this also increases the efficiency. Furthermore, the apparatus can perform various processing steps meeting the user's needs, e.g., continuous etching-etching processing and single etching processing, by changing the program. This makes the apparatus extremely versatile.

Figure 26:
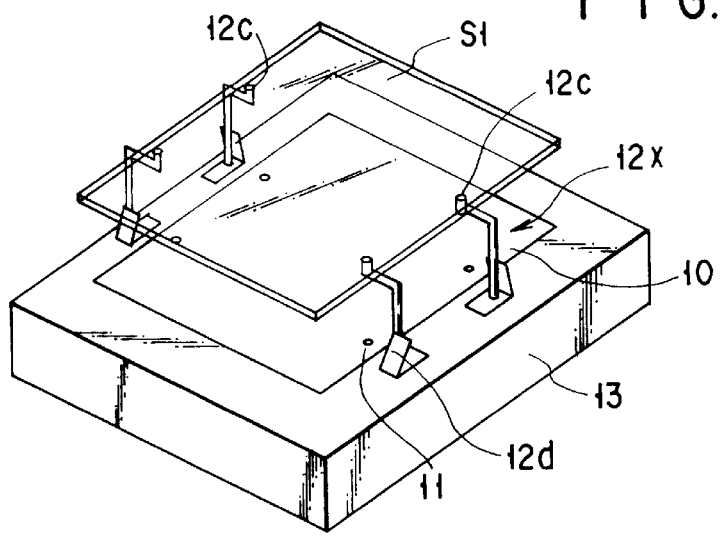
FIG. 26 is a view showing a modification of the support members for supporting an unprocessed substrate in the processing chamber of the apparatus shown in FIG. 18.
Figure 27A:
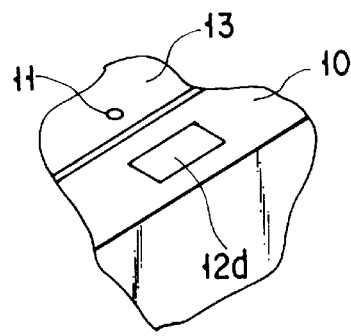
FIGS. 27A and 27B are views showing the operation of the support members shown in FIG. 26.
Figure 27B:
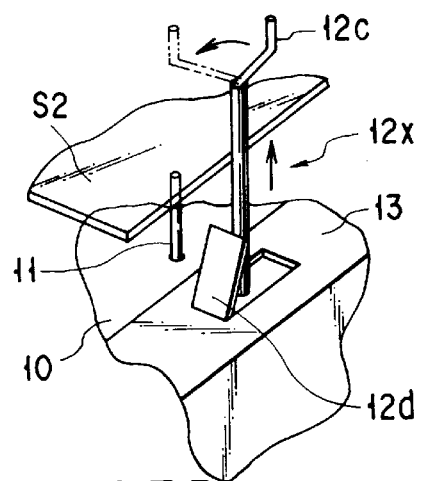

For example, in this embodiment, a member formed by attaching the flat extending member 12b to the distal end of the support rod 12a is used as the support member 12. However, as shown in FIG. 26, this support member 12a can be a pin-like support member 12x having a hook 12c in its distal end. When retreated, as shown in FIG. 27A, the support member 12x is completely retreated into a shield member 13 and a cover 12d is closed on the support member 12x. To advance the support member 12x to a support position, as shown in FIG. 27B, the cover 12d is opened and the support member 12x moves up to the support position and rotates in that position to project the hook 12c toward the susceptor 10. Also, the support members (first support members) for supporting an unprocessed substrate are not limited to members which advance and retreat, i.e., ascend and descend. For example, members which retreat by rotation can be used.

Furthermore, the catcher 66, i.e., the holding unit is not restricted to the one described above, and various other constructions can be used. In addition, although the two forks, i.e., upper and lower forks fixedly disposed are used as the catcher, these forks can also be moved independently of each other. Also, the substrate support members are not limited to forks, so it is possible to use plate-like members like the arms 52 and 53 of the transfer mechanism 50.

Figure 28:
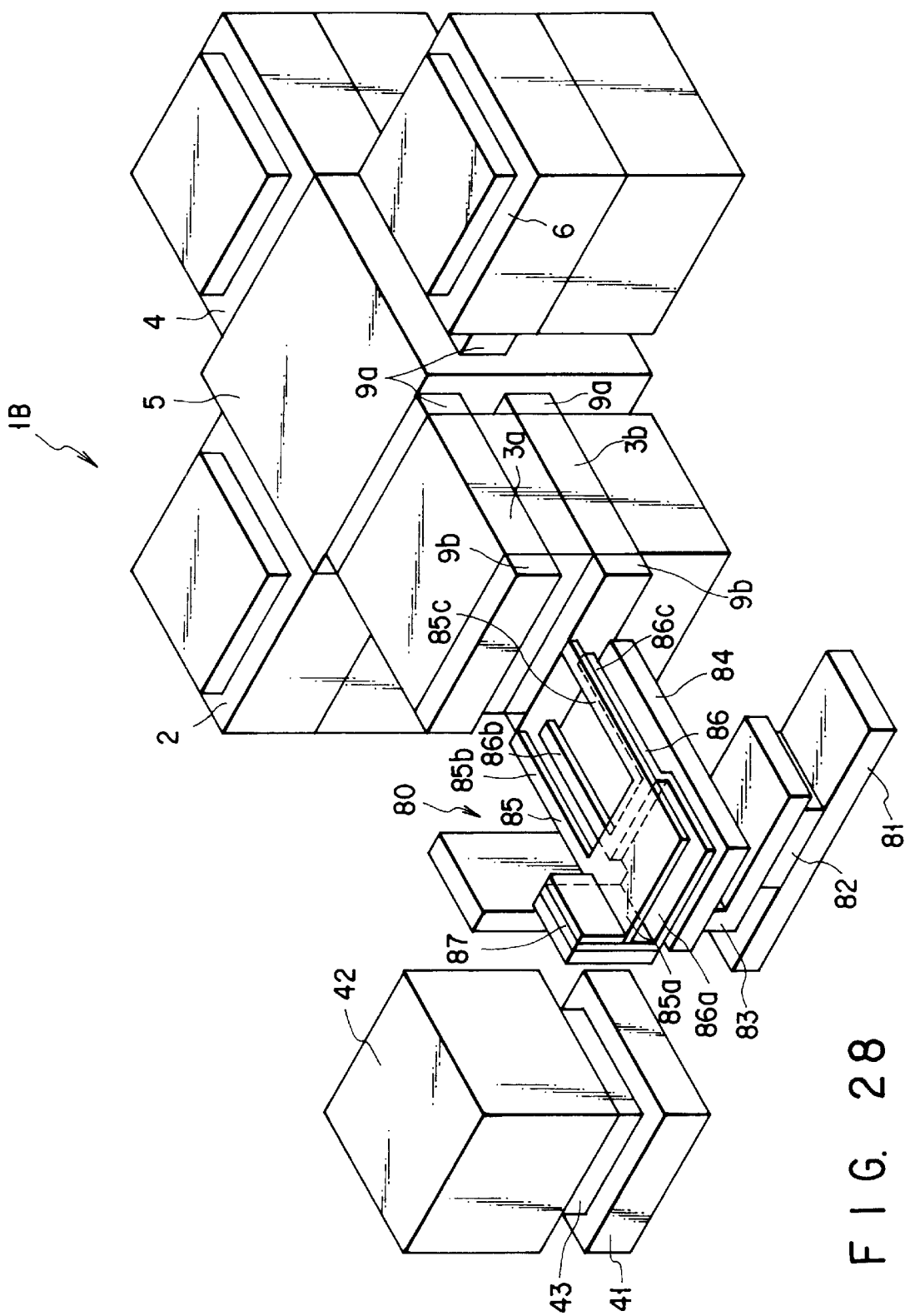
FIG. 28 is a perspective view showing the outline of a vacuum processing apparatus according to still another embodiment of the present invention.
Figure 29:
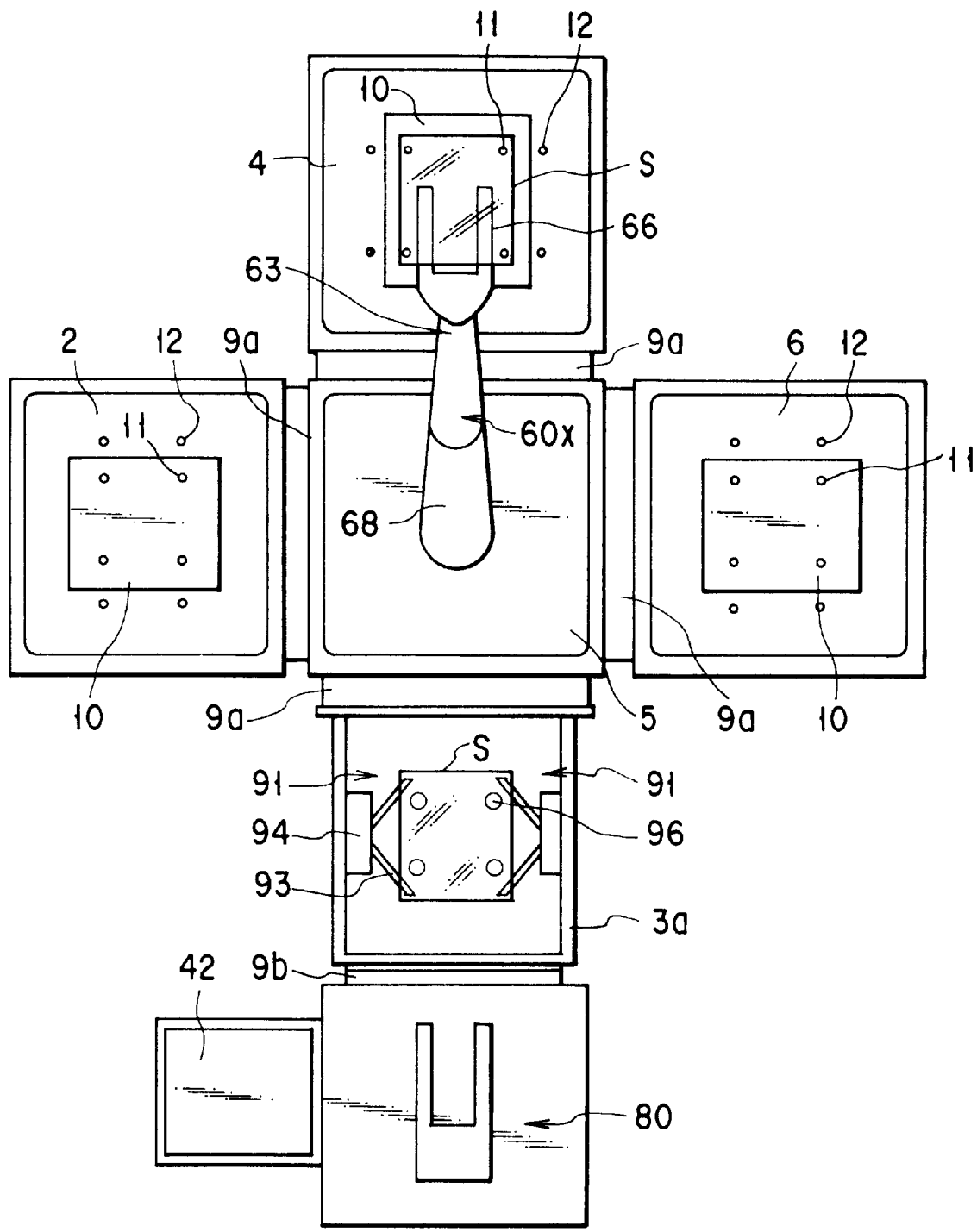
FIG. 29 is a schematic cross-sectional plan view showing the interior of the apparatus shown in FIG. 28.
Figure 30:
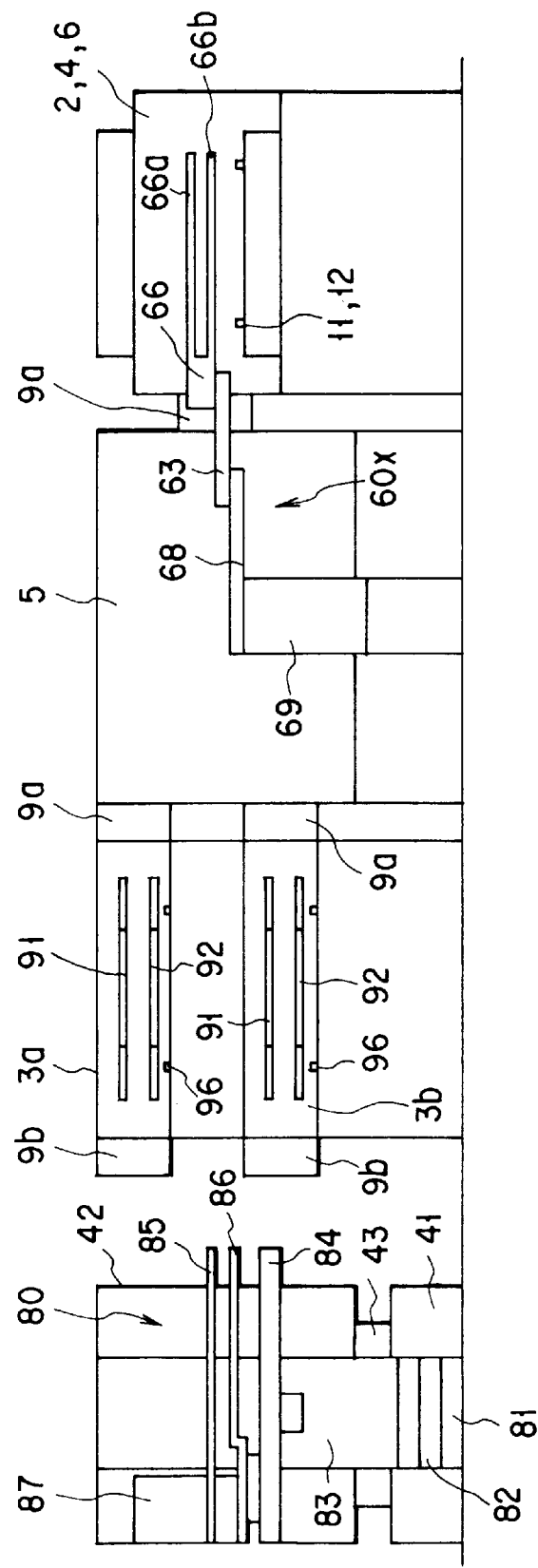
FIG. 30 is a schematic side view showing the interior of the apparatus shown in FIG. 28.

FIG. 28 is a perspective view showing the outline of a vacuum processing apparatus according to still another embodiment of the present invention. FIGS. 29 and 30 are a schematic cross-sectional plan view and a schematic side view, respectively, showing the interior of the apparatus. The same reference numerals as in the two previous embodiments described with reference to FIGS. 1 to 27B denote the same parts in FIGS. 28 to 30, and a detailed description thereof will be omitted.

As shown in FIG. 28, a processing apparatus 1B according to this embodiment has three chambers 2, 4, and 6 similar to those of the embodiment shown in FIG. 18. These processing chambers 2, 4, and 6 are connected to three sides of a transfer chamber 5 with a square planar shape via gate valves 9a. For example, the same etching processing is performed in the processing chambers 2 and 6, and ashing processing is performed in the processing chamber 4.

As in the preceding embodiment, a susceptor 10 having four support pins 11 and four support members 12 is disposed in each of the processing chambers 2, 4, and 6. Accordingly, as described above, in each of the processing chambers 2, 4, and 6, it is possible to exchange processed and unprocessed substrates by a single forward movement of a transfer mechanism 60 disposed in the transfer chamber 5.

Two chambers, i.e., upper and lower load-lock chambers 3a and 3b are connected to the remaining side of the transfer chamber 5 via gate valves 9a. To transfer LCD substrates S between the load-lock chambers 3a and 3b and a substrate cassette 42, a transfer mechanism having the same structure as the transfer mechanism 80 shown in FIG. 17 is disposed instead of the transfer mechanism 50.

The transfer mechanism 80 has a base plate 81, and a slider 82 is so disposed as to be slidable along the longitudinal direction of the base plate 81. An L-shaped stand 83 is mounted on the slider 82 so as to be rotatable in the horizontal plane. Additionally, a vertically movable horizontal plate 84 is attached to the vertical portion of the stand 83.

Upper and lower forks 85 and 86 for supporting the substrates S on them are disposed on the horizontal plate 84. The lower fork 86 is so mounted on the horizontal plate 84 as to be slidable along the longitudinal direction of the horizontal plate 84. A substand 87 extends vertically from a proximal portion 86a of the lower fork 86, and the upper fork 85 is vertically movably attached to the substand 84. Accordingly, the upper and lower forks 85 and 86 together slide along the longitudinal direction of the horizontal plate 84.

Fingers 85b and 85c of the upper fork 85 and fingers 86b and 86c of the lower fork 86 have the same thickness in the vertical direction, and this thickness is smaller than the interval at which the substrates S are stored in the cassette 42. Also, the width between the edges of the fingers 85b and 85c of the upper fork 85 is so set as to be slightly larger than the width between the edges of the fingers 86b and 86c of the lower fork 86. In addition, the proximal portion 86a of the lower fork 86 is recessed from the level of the fingers 86b and 86c by the thickness of a base portion 85a of the upper fork 85.

Accordingly, when the upper fork 85 descends to the lowermost position, the fingers 85b and 85c of the upper fork 85 and the fingers 86b and 86c of the lower fork 86 can overlap each other like a single plate when viewed sideways. In this state, the fingers 85b and 85c of the upper fork 85 are positioned just outside, and on the same level as, the fingers 86b and 86c of the lower fork 86. Also, in this state, at least the top support surfaces of the two forks 85 and 86 are leveled with each other. Since the two forks 85 and 86 have the same thickness in this embodiment, both the top and bottom support surfaces of the forks 85 and 86 are leveled with each other.

When the transfer mechanism 80 with the above arrangement is used, the loading of a processed substrate into the cassette 42 and the unloading of an unprocessed substrate from the cassette can be performed in parallel with each other, and this improves the throughput. Since the transfer mechanism 80 has only one rotating system and all the other systems are linear sliding systems, the mechanism 80 can perform a high-speed stable operation.

The load-lock chambers 3a and 3b can be individually set and maintained in respective arbitrary reduced pressure atmospheres. Therefore, the load-lock chambers 3a and 3b are connected to the transfer chamber 5 via the individually operable gate valves 9a and connected to the outer atmosphere via individually operable gate valves 9b.

In this embodiment, each of the load-lock chambers 3a and 3b has the same internal structure as shown in FIG. 31. That is, the load-lock chamber 3a (3b) has two horizontal substrate support levels and holds two substrates S at once. The upper support level is defined by a pair of opposing hands 91, and the lower support level is defined by a pair of opposing hands 92.

Each of these hands 91 and 92 has a pair of fingers 93 so designed as to spread forward. The fingers 93 are attached to a driving unit 94 mounted on the inner wall and swung by the driving unit 94 between the position shown in FIG. 31 and a retreated position in which the fingers 93 retreat toward the side wall.

In the load-lock chamber 3a (3b), four support pins 96 vertically driven by a driving unit (not shown) disposed below the bottom wall are arranged. These support pins 96 can move between a retreated position in which the pins 96 retreat to a portion below the bottom wall and a projected position in which they project higher than the upper support level defined by the hands 91. The support pins 96 can also stop at an arbitrary position.

When the fingers 93 are closed in the position shown in FIG. 31, the hands 91 and 92 can support the substrates S on the respective corresponding support levels. When the fingers 93 are opened to the retreated position, the substrate S supported on the support pins 96 can pass through the opposing hands 91 or the opposing hands 92.

In this embodiment, a transfer mechanism 60x disposed in the transfer chamber 5 includes a catcher 66 having two forks, i.e., upper and lower forks 66a and 66b, but no buffer frame 70 is provided. This is because the apparatus has the two load-lock chambers, i.e., the upper and lower load-lock chambers 3a and 3b and the exchange of processed and unprocessed substrates can be performed by one forward movement of the transfer mechanism 60x not only in the processing chambers 2, 4, and 6 but also in the load-lock chambers 3a and 3b, and so the buffer frame 70 can be omitted. In addition, since it is not necessary to direct the catcher 66 toward the buffer frame 70, the catcher 66 and a base 68 can be connected by one intermediate arm 63. Also, the base 68 can be vertically driven by a cylinder mechanism 69.

With the above construction, processed and unprocessed substrates can be exchanged by one forward movement of the transfer mechanism 60x in each of the load-lock chambers 3a and 3b. This operation is analogous to the exchange of processed and unprocessed substrates accomplished by arranging the support pins 11 and the support members 12 on the susceptor 10 in each of the processing chambers 2, 4, and 6.

Note that the fingers 93 of the hands 91 and 92 in the load-lock chambers 3a and 3b are made openable in order to perform an additional operation of, e.g., transferring the processed substrate S from the upper support level to the lower support level in a spare time. Accordingly, if it is only necessary to exchange processed and unprocessed substrates by one forward movement of the transfer mechanism 60x, the fingers 93 of the hands 91 and 92 need not be openable, i.e., they can be fixed in the position shown in FIG. 31.

The operation of exchanging processed and unprocessed substrates in the load-lock chamber 3a (3b) by using the transfer mechanism 60x of the transfer chamber 5 will be described below. Assume that a processed substrate S1 is supported on the lower fork 66b of the transfer mechanism 60x and an unprocessed substrate S2 is supported on the hands 91 (upper support level) in the load-lock chamber 3a. Assume also that the spacing between the upper and lower support levels in the load-lock chamber 3a is larger than the spacing between the upper and lower support levels of the transfer mechanism 60x. Note that the explanation of additional operations of, e.g., the gate valves 9a will be omitted.

First, the catcher 66 supporting the processed substrate S1 on the lower fork 66b is inserted into the load-lock chamber 3a in which the unprocessed substrate S2 is supported on the hands 91. The catcher 66 is so inserted that both of the upper and lower forks 66a and 66b are positioned between the upper and lower hands 91 and 92 of the load-lock chamber 3a.

Subsequently, the support pins 96 are raised to receive the processed substrate S1 from the lower fork 66b of the catcher 66. The catcher 66 is then raised together with the support pins 96 to allow the upper fork 66a to receive the unprocessed substrate S2 from the hands 91.

The catcher 66 supporting the unprocessed substrate S2 on the upper fork 66a is retreated to the transfer chamber 5. The support pins 96 are lowered to place the processed substrate S1 on the hands 92 (lower support level).

The operation which is performed subsequently to the above operation to exchange the processed and unprocessed substrates in the load-lock chamber 3a (3b) by using the transfer mechanism 80 in the outer atmosphere will be described below. Assume that the processed substrate S1 is supported on the hands 92 (lower support level) in the load-lock chamber 3a and an unprocessed substrate S3 is supported on the upper fork 85 of the transfer mechanism 80. Note that the explanation of additional operations of, e.g., the gate valves 9b will be omitted.

First, the transfer mechanism 80 supporting the unprocessed substrate S3 on the upper fork 85 is inserted into the load-lock chamber 3a in which the processed substrate S1 is supported on the hands 92. At this time, the spacing between the upper and lower forks 85 and 86 of the transfer mechanism 80 is previously widened so that the upper and lower hands 91 and 92 of the load-lock chamber 3a are positioned between the upper and lower forks 85 and 86.

Subsequently, the horizontal plate 84 of the transfer mechanism 80 is raised and at the same time the upper fork 85 is moved toward the lower fork 86. By this operation, the spacing between the upper and lower forks 85 and 86 can be narrowed while the two forks are being raised. Consequently, it is possible to load the unprocessed substrate S3 from the upper fork 85 onto the upper hands 91 and at the same time receive the processed substrate S1 from the lower hands 92 to the lower fork 86.

Figure 32:
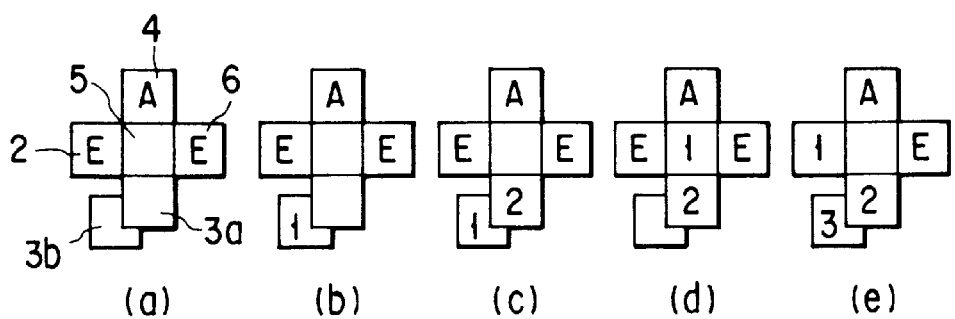
FIG. 32 is a view showing a substrate transfer sequence in the apparatus shown in FIG. 28 in order.
Figure 32:
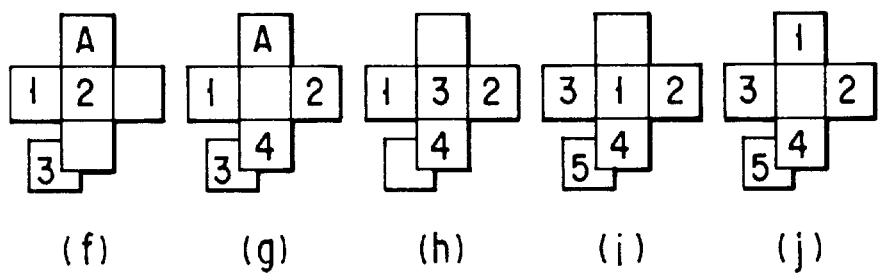
Figure 32:
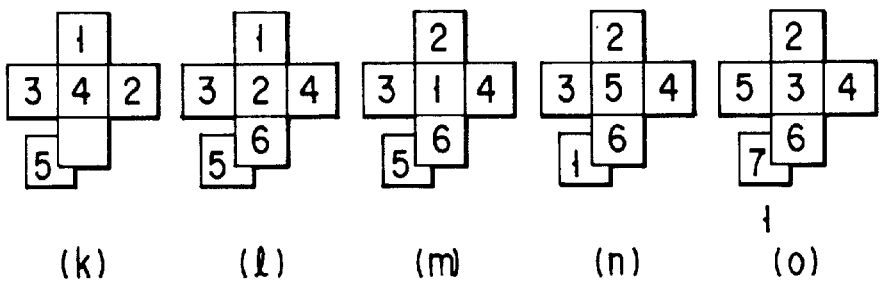
Figure 32:
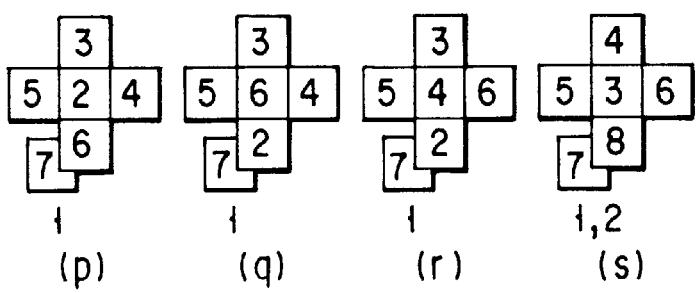

FIG. 32 is a view for explaining the LCD substrate transfer sequence in order, which is performed in the vacuum processing apparatus according to the embodiment described with reference to FIGS. 28 to 31. Referring to FIG. 32, it is assumed that the same etching processing is performed in the processing chambers 2 and 6 and ashing processing is performed in the processing chamber 4. In FIG. 32, the individual chambers of the processing apparatus are denoted by their respective reference numerals only in (a) in order to avoid confusion. In (b) to (s), only the numbers of substrates S1 to S8 as the LCD substrates S are shown.

First, the substrate S1 is introduced into the lower load-lock chamber 3b and the substrate S2 is introduced into the upper load-lock chamber 3a ((b) and (c) in FIG. 32). The substrate S1 is loaded into the processing chamber 2 from the lower load-lock chamber 3b via the transfer chamber 5 ((d) in FIG. 32), and etching of the substrate S1 is started. In parallel with the loading of the substrate S1 into the processing chamber 2, the substrate S3 is transferred into the lower load-lock chamber 3b ((e) in FIG. 32). While the substrate S1 is being processed, the substrate S2 is loaded into the processing chamber 6 from the upper load-lock chamber 3a via the transfer chamber 5 ((f) in FIG. 32), and etching of the substrate S2 is started. In parallel with the loading of the substrate S2 into the processing chamber 6, the substrate S4 is transferred into the upper load-lock chamber 3a ((g) in FIG. 32).

Subsequently, while the substrates S1 and S2 are being processed, the substrate S3 is moved from the lower load-lock chamber 3b to the transfer chamber 5 ((h) in FIG. 32). In addition, while the substrate S2 is being processed, the etched substrate S1 and the substrate S3 are exchanged by a single forward movement of the transfer mechanism 60x. By doing so, the substrate S1 is unloaded to the transfer chamber 5 and the substrate S3 is loaded into the processing chamber 2. In parallel with this operation, the substrate S5 is transferred into the lower load-lock chamber 3b ((i) in FIG. 32).

While the substrates S2 and S3 are being processed, the substrate S1 is loaded from the transfer chamber 5 into the processing chamber 4, and ashing of the substrate S1 is started ((j) in FIG. 32). In addition, while the substrates S2, S3, and S1 are being processed, the substrate S4 is moved from the upper load-lock chamber 3a to the transfer chamber 5 ((k) in FIG. 32). While the substrates S3 and S1 are being processed, the etched substrate S2 and the substrate S4 are exchanged by a single forward movement of the transfer mechanism 60x. By doing so, the substrate S2 is unloaded to the transfer chamber 5 and the substrate S4 is loaded into the processing chamber 6. In parallel with this operation, the substrate S6 is transferred into the upper load-lock chamber 3a ((l) in FIG. 32).

While the substrates S3 and S4 are being processed, the ashed substrate S1 and the substrate S2 are exchanged by one forward movement of the transfer mechanism 60x. By doing so, the substrate S1 is unloaded to the transfer chamber 5 and the substrate S2 is loaded into the processing chamber 4 ((m) in FIG. 32). In addition, while the substrates S3, S4, and S2 are being processed, the completely processed substrate S1 and the substrate S5 are exchanged by one forward movement of the transfer mechanism 60x. By doing so, the substrate S1 is returned to the lower load-lock chamber 3b and the substrate S5 is moved to the transfer chamber 5 ((n) in FIG. 32). While the substrates S4 and S2 are being processed, the etched substrate S3 and the substrate S5 are exchanged by one forward movement of the transfer mechanism 60x. By doing so, the substrate S3 is unloaded to the transfer chamber 5 and the substrate S5 is loaded into the processing chamber 2. In parallel with this operation, the completely processed substrate S1 and the substrate S7 are exchanged by a single forward movement of the transfer mechanism 80 in the outer atmosphere. By doing so, the substrate S1 is unloaded from the apparatus and the substrate S7 is loaded into the load-lock chamber 3b ((o) in FIG. 32).

By repeating the same operation ((p) to (s) in FIG. 32), the substrates S1 to S8 can be completely processed and unloaded from the vacuum processing apparatus in increasing order of the numbers.

In the above processing, the efficiency at which substrates are exchanged in the processing chambers and the load-lock chambers is increased. This accomplishes an extremely high throughput which has been conventionally impossible.

The present invention is not limited to the above embodiments, and various modifications can be made without departing from the spirit and scope of the invention. In particular, although the characteristic features of the processing apparatus have been separately described in the individual embodiments, any arbitrary combination of these characteristic portions is possible. For example, the combination of the support pins 11 and the support members 12 described with reference to, e.g., FIG. 21 and the transfer mechanism 60 described with reference to FIG. 20 can be used in the processing apparatus shown in FIG. 1. Also, the transfer mechanism 20 described with reference to, e.g., FIG. 3 and the load-lock chambers 3a and 3b described with reference to FIG. 31 can be used in the processing apparatus shown in FIG. 18. Additionally, the load-lock chamber described with reference to FIG. 5 and the transfer mechanism 60 described with reference to FIG. 20 can be used in the processing apparatus shown in FIG. 28.

Furthermore, the present invention can be effectively applied to a processing apparatus having a single processing chamber and can also be applied to an atmospheric or positive pressure processing apparatus as well as a vacuum processing apparatus. The present invention is also applicable to various processing apparatuses, such as a film forming apparatus, in addition to etching and ashing apparatuses. Moreover, substrates to be transferred are not limited to LCD substrates but can be some other substrates such as semiconductor substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor processing apparatus comprising:
    a storage section for storing a plurality of target substrates by vertically arranging the substrates at first intervals;
    an external transfer mechanism for unloading the substrates from said storage section; and
    a processing section into which the substrates are loaded by said external transfer mechanism and which performs semiconductor processing for the substrates,
    wherein said external transfer mechanism comprises
        first and second arms defining first and second support surfaces each of which can support one of the substrates and capable of vertically moving relative to each other,
        an interval adjuster for adjusting an interval in a vertical direction between the first and second support surfaces by moving said first and second arms relative to each other, and
        an arm driving base for moving said first and second arms between a position at which said first and second arms oppose said storage section and a position at which said first and second arms oppose said processing section, and
    wherein a thickness in the vertical direction of each of said first and second arms is smaller than said first intervals, and said first and second arms can be set in an overlapping state, in which said first and second arms overlap each other in a horizontal direction, by said interval adjuster.

2. An apparatus according to claim 1, wherein in the overlapping state, the first and second support surfaces are leveled with each other.

3. An apparatus according to claim 2, wherein said first and second arms have substantially the same thickness in the vertical direction.

4. An apparatus according to claim 3, wherein said first arm has an opening and said second arm has a contour which forms a complementary shape of the opening.

5. An apparatus according to claim 1, wherein said arm driving base can vertically and integrally move said first and second arms.

6. An apparatus according to claim 1, wherein said processing section comprises a first load-lock chamber that said first and second arms can access through a gate and which can be set in a reduced pressure atmosphere, and said first load-lock chamber has first and second support levels each of which can support one of the substrates and which are vertically stacked.

7. An apparatus according to claim 6, wherein said processing section comprises a transfer chamber which is connected to said first load-lock chamber via a gate and can be set in a reduced pressure atmosphere, and a first processing chamber which is connected to said transfer chamber via a gate and performs the semiconductor processing in a reduced pressure atmosphere, and wherein an internal transfer mechanism for transferring the substrates between said first load-lock chamber and said first processing chamber is disposed in said transfer chamber, and said internal transfer mechanism comprises a transfer member having first and second holding portions each of which can hold one of the substrates and which are vertically stacked.

8. An apparatus according to claim 7, wherein said processing section comprises a second load-lock chamber that said first and second arms can access through a gate, which can be set in a reduced pressure atmosphere, and which is connected to said transfer chamber via a gate, and said first and second load-lock chambers are vertically stacked.

9. An apparatus according to claim 7, wherein a second processing chamber for performing semiconductor processing in a reduced pressure atmosphere is connected to said transfer chamber via a gate.

10. An apparatus according to claim 7, further comprising:
- a work table disposed in said first processing chamber to support one of the substrates;
- a first support member which can be selectively set in an advanced state for supporting one of the substrates in a first position above said work table and a retreated state; and
- a second support member which can be selectively set in an advanced state for supporting one of the substrates in a second position above said work table and a retreated state, the first and second positions being so arranged as to be vertically stacked,
- wherein with a first substrate as one of the substrates being held by said first holding portion of said transfer member and a second substrate as another one of the substrates being supported by said second support member, said first and second support members are vertically moved in opposite directions relative to said transfer member while said transfer member is positioned at a predetermined forward position above said work table, thereby transferring the first substrate from said first holding portion to said first support member and the second substrate from said second support member to said second holding portion.

11. An apparatus according to claim 9, wherein when the first and second substrates are to be transferred, said first and second support members vertically move with said transfer member being stopped.

12. A semiconductor processing apparatus comprising:
- a storage section for storing a plurality of target substrates by vertically arranging the substrates;
- an external transfer mechanism for unloading the substrates from said storage section; and
- a processing section into which the substrates are loaded by said external transfer mechanism and which performs semiconductor processing for the substrates,
- wherein said processing section comprises
  - a work table for supporting one of the substrates,
  - a first support member which can be selectively set in an advanced state for supporting one of the substrates in a first position above said work table and a retreated state,
  - a second support member which can be selectively set in an advanced state for supporting one of the substrates in a second position above said work table and a retreated state, the first and second positions being so arranged as to be vertically stacked, and
  - an internal transfer mechanism for loading and unloading the substrates onto and from said work table, said internal transfer mechanism comprising a transfer member having first and second holding portions each of which can hold one of the substrates and which are vertically stacked in correspondence with the first and second positions, and
  - wherein with a first substrate as one of the substrates being held by said first holding portion of said transfer member and a second substrate as another one of the substrates being supported by said second support member, said first and second support members are vertically moved in opposite directions relative to said transfer member while said transfer member is positioned at a predetermined forward position above said work table, thereby transferring the first substrate from said first holding portion to said first support member and the second substrate from said second support member to said second holding portion.

13. An apparatus according to claim 12, wherein when the first and second substrates are to be transferred, said first and second support members vertically move with said transfer member being stopped.

14. An apparatus according to claim 12, wherein said second support member comprises a plurality of support pins capable of projecting and retreating with respect to said work table, can support one of the substrates in the second position when said support pins project, and can load one of the substrates onto said work table when said support pins retreat.

15. An apparatus according to claim 12, wherein the first position is arranged above the second position, and said first support member has a plurality of support rods which are positioned outside the second substrate and extending members projecting inward from upper ends of said support rods, and wherein after the first substrate is loaded onto said extending members in the first position, and the second substrate is transferred by said transfer member, the first substrate is transferred from said first support member to said second support member and said first support member retreats.

16. An apparatus according to claim 15, wherein said support rods of said first support member are so provided as to be able to project and retreat with respect to said work table, said extending members provided on the distal end portions of said support rods so as to be able to move outside said work table, and said first support member retreats when said extending members move outside said work table and at the same time said support rods retreat.

17. An apparatus according to claim 13, wherein said processing section comprises a transfer chamber which can be set in a reduced pressure atmosphere, and a first processing chamber which is connected to said transfer chamber via a gate and performs the semiconductor processing in a reduced pressure atmosphere, and wherein said work table is disposed in said first processing chamber, and said internal transfer mechanism is disposed in said transfer chamber.

18. An apparatus according to claim 17, wherein said processing section comprises a first load-lock chamber which is connected to said transfer chamber via a gate and can be set in a reduced pressure atmosphere, and said first load-lock chamber has first and second support levels each of which can support one of the substrates and which are vertically stacked.

19. An apparatus according to claim 18, wherein said first load-lock chamber comprises a plurality of support pins capable of vertically moving through the first and second levels and cooperating to support one of the substrates.

20. An apparatus according to claim 19, wherein said internal transfer mechanism can vertically move said transfer member.

21. An apparatus according to claim 18, wherein said processing section comprises a second load-lock chamber which is connected to said transfer chamber via a gate and can be set in a reduced pressure atmosphere, and said first and second load-lock chambers are vertically stacked.

22. An apparatus according to claim 17, wherein a second processing chamber for performing semiconductor processing in a reduced pressure atmosphere is connected to said transfer chamber via a gate.

23. A semiconductor processing apparatus comprising:
- a storage section for storing a plurality of target substrates by vertically arranging the substrates;
- an external transfer mechanism for unloading the substrates from said storage section, said external transfer mechanism having first and second arms defining first and second support surfaces each of which can support one of the substrates and which are vertically stacked;
- a first load-lock chamber that said first and second arms can access through a gate and which can be set in a reduced pressure atmosphere;
- a transfer chamber which is connected to said first load-lock chamber via a gate and can be set in a reduced pressure atmosphere;
- a first processing chamber which is connected to said transfer chamber via a gate and performs semiconductor processing in a reduced pressure atmosphere; and
- an internal transfer mechanism disposed in said transfer chamber to transfer the substrates between said first load-lock chamber and said first processing chamber, said internal transfer mechanism comprising a transfer member having first and second holding portions each of which can hold one of the substrates and which are vertically stacked,
- wherein said first load-lock chamber has first and second support levels each of which can support one of the substrates and which are vertically stacked, and comprises a plurality of support pins capable of vertically moving through the first and second levels and cooperating to support one of the substrates.

24. An apparatus according to claim 23, wherein said internal transfer mechanism can vertically move said transfer member.

25. An apparatus according to claim 23, wherein said external transfer mechanism can vertically move said first and second arms.

26. An apparatus according to claim 23, wherein said processing chamber comprises a second load-lock chamber which is connected to said transfer chamber via a gate and can be set in a reduced pressure atmosphere, and said first and second load-lock chambers are vertically stacked.

27. An apparatus according to claim 23, wherein a second processing chamber for performing semiconductor processing in a reduced pressure atmosphere is connected to said transfer chamber via a gate.

* * * * *

UNITED STATES PATENT AND TRADEMARK OFFICE
CERTIFICATE OF CORRECTION

PATENT NO.  : 5,989,346
DATED       : November 23, 1999
INVENTOR(S) : Tsutomu Hiroki It is certified that error appears in the above-identified patent and that said Letters Patent is hereby corrected as shown below:

On the title page, item [30] is incorrect, it should be:

-- [30]     Foreign Application Priority Data

Dec. 12, 1995    [JP]  Japan ........................ .................. 7-323094
   Jan. 26, 1996    [JF]  Japan ........ ............................. 8-032927
   Nov. 25, 1996    [JP]  Japan .......... ............ .................... 8-313420--

Signed and Sealed this

Twenty-third Day of January, 2001

Attest:

Attesting Officer

Q. TODD DICKINSON

Commissioner of Patents and Trademarks